(12) United States Patent
Artelsmair et al.

(10) Patent No.: US 10,141,106 B2
(45) Date of Patent: Nov. 27, 2018

(54) HEAVY-CURRENT TRANSFORMER HAVING A MULTI-POINT CONTACTING, TRANSFORMER ELEMENT, CONTACT PLATE AND SECONDARY WINDING, AND METHOD FOR PRODUCING SUCH A HEAVY-CURRENT TRANSFORMER

(71) Applicant: FRONIUS INTERNATIONAL GMBH, Pettenbach (AT)

(72) Inventors: Bernhard Artelsmair, Pettenbach (AT); Christoph Schultschik, Pettenbach (AT); Johannes Neuboeck, Steinerkirchen/Tr. (AT); Stefan Wolfsgruber, Gmunden (AT)

(73) Assignee: FRONIUS INTERNATIONAL GMBH, Pettenbach (AT)

( * ) Notice: Subject to any disclaimer, the term of this patent is extended or adjusted under 35 U.S.C. 154(b) by 378 days.

(21) Appl. No.: 14/354,982

(22) PCT Filed: Oct. 31, 2012

(86) PCT No.: PCT/AT2012/000273
§ 371 (c)(1),
(2) Date: Apr. 29, 2014

(87) PCT Pub. No.: WO2013/063626
PCT Pub. Date: May 10, 2013

(65) Prior Publication Data
US 2014/0313679 A1    Oct. 23, 2014

(30) Foreign Application Priority Data

Oct. 31, 2011  (AT) .................................. 1601/2011

(51) Int. Cl.
*H01F 27/29*   (2006.01)
*H01F 41/02*   (2006.01)
(Continued)

(52) U.S. Cl.
CPC ............ *H01F 41/02* (2013.01); *B23K 11/241* (2013.01); *B23K 11/314* (2013.01); *H01F 27/08* (2013.01);
(Continued)

(58) Field of Classification Search
CPC ............ H01F 27/29; H01F 27/08; H05K 1/18
(Continued)

(56) References Cited

U.S. PATENT DOCUMENTS 2,364,881 A * 12/1944 Tyrner ................. B23K 9/1031
307/151
2,542,851 A *  2/1951 Wentz ..................... H01F 27/16
336/170
(Continued)

FOREIGN PATENT DOCUMENTS

DE      10 2007 042 771 B3     1/2009
EP         1 496 527 A1         1/2005
(Continued)

OTHER PUBLICATIONS

Japanese Examination Report in JP 2014-537421, dated May 12, 2015, with English translation of relevant parts.
(Continued)

*Primary Examiner* — Jimmy Chou
(74) *Attorney, Agent, or Firm* — Collard & Roe, P.C.

(57) ABSTRACT

The invention relates to a heavy-current transformer (12), in particular for a power source (10) in order to provide a welding current of a resistance welding device (1), with at least one primary winding (13) and at least one secondary winding (14) with center tapping, and to a transformer element, a contact plate (29) and a secondary winding (14) for such a heavy-current transformer (12) as well as a method for the manufacturing thereof. For reduction of losses and improvement of efficiency, at least four contacts (Continued)

(20, 21, 22, 23) are provided to form a multi-point contacting, said contacts (20, 21, 22, 23) being formed by four contact faces within which the at least one primary winding (13) and the at least one secondary winding (14) are arranged in a series/parallel connection.

13 Claims, 15 Drawing Sheets

(51) Int. Cl.

| | | |
|---|---|---|
| B23K 11/24 | (2006.01) | |
| B23K 11/31 | (2006.01) | |
| H01F 38/08 | (2006.01) | |
| H01F 27/08 | (2006.01) | |
| H05K 1/18 | (2006.01) | |
| H05K 3/34 | (2006.01) | |
| H01F 27/16 | (2006.01) | |
| H01F 27/20 | (2006.01) | |

(52) U.S. Cl.
CPC ............. *H01F 27/16* (2013.01); *H01F 27/20* (2013.01); *H01F 27/29* (2013.01); *H01F 38/085* (2013.01); *H05K 1/18* (2013.01); *H05K 3/34* (2013.01); *H05K 2201/1003* (2013.01); *Y10T 29/4902* (2015.01)

(58) Field of Classification Search
USPC ....... 336/145, 146, 147, 148, 182, 173, 170, 336/198; 219/130.21, 130.1, 130.51
See application file for complete search history.

(56) References Cited

U.S. PATENT DOCUMENTS

| | | | | |
|---|---|---|---|---|
| 3,016,484 | A * | 1/1962 | Rasmusen | B23K 9/1006 219/130.1 |
| 3,119,085 | A * | 1/1964 | Tiejema | H01F 27/323 336/173 |
| 3,200,357 | A | 8/1965 | Olsen et al. | |
| 3,246,271 | A * | 4/1966 | Ford | H01B 3/30 156/291 |
| 3,253,646 | A * | 5/1966 | Koltuniak | H01F 27/08 165/104.34 |
| 3,418,563 | A * | 12/1968 | Grosu | B23K 9/1012 323/340 |
| 3,460,022 | A * | 8/1969 | Riley | H01L 23/473 219/116 |
| 3,495,067 | A * | 2/1970 | Sciaky | H01L 23/473 219/108 |
| 3,525,908 | A * | 8/1970 | Allmendinger | H01F 38/30 336/174 |
| 3,558,850 | A * | 1/1971 | Leathers | B23K 11/314 219/116 |
| 3,665,150 | A * | 5/1972 | Mejia | B23K 9/1056 219/130.1 |
| 3,711,759 | A * | 1/1973 | Krauthamer | H02H 7/1227 333/175 |
| 3,840,720 | A * | 10/1974 | Wolf | H02M 7/068 219/116 |
| 4,376,884 | A | 3/1983 | Gold et al. | |
| 4,538,346 | A | 9/1985 | Street | |
| 4,544,906 | A * | 10/1985 | Mota | H01F 5/06 336/206 |
| 4,571,669 | A * | 2/1986 | Tsujii | B23K 11/314 219/116 |
| 4,682,000 | A * | 7/1987 | Holt | H01F 27/2828 219/108 |
| 4,748,342 | A * | 5/1988 | Dijkmans | H02J 7/022 307/64 |
| 4,750,101 | A * | 6/1988 | Morita | H01F 27/40 363/126 |
| 4,897,522 | A * | 1/1990 | Bilczo | H02M 3/285 219/130.32 |
| 5,023,423 | A * | 6/1991 | Tsujii | H01F 27/40 219/108 |
| 5,138,115 | A | 8/1992 | Lam | |
| 5,138,129 | A * | 8/1992 | Umeda | B23K 11/314 219/116 |
| 5,160,877 | A * | 11/1992 | Fujiwara | B25J 9/1015 310/90.5 |
| 5,276,296 | A * | 1/1994 | Kawada | B23K 11/314 219/108 |
| 5,349,157 | A * | 9/1994 | Blankenship | B23K 9/1006 219/130.32 |
| 5,351,175 | A * | 9/1994 | Blankenship | B23K 9/1056 219/137 PS |
| 5,642,260 | A * | 6/1997 | Sigl | B23K 9/32 174/16.1 |
| 5,684,341 | A * | 11/1997 | Steingroever | B21D 26/14 307/109 |
| 5,831,240 | A * | 11/1998 | Katooka | B23K 9/323 219/130.1 |
| 6,269,015 | B1 * | 7/2001 | Ikeda | B23K 9/091 219/130.21 |
| 6,369,680 | B1 * | 4/2002 | Brinckmann | H01F 38/085 336/180 |
| 6,489,591 | B1 * | 12/2002 | Achtner | B23K 9/32 219/130.1 |
| 6,570,130 | B1 * | 5/2003 | Kooken | B23K 9/1006 219/130.01 |
| 6,611,189 | B2 * | 8/2003 | Sigl | H01F 38/085 336/192 |
| 6,665,183 | B1 * | 12/2003 | Shikata | H05K 7/20918 257/721 |
| 6,794,976 | B2 * | 9/2004 | Sigl | H01F 38/085 219/670 |
| 6,937,129 | B2 * | 8/2005 | Hsueh | H01F 27/2823 336/198 |
| 6,998,573 | B2 * | 2/2006 | Kooken | H01F 38/085 219/130.1 |
| 7,046,111 | B2 * | 5/2006 | Sigl | H01F 3/14 336/178 |
| 7,067,767 | B2 * | 6/2006 | Hsu | B23K 9/1056 219/130.21 |
| 7,141,759 | B2 * | 11/2006 | Mela | B23K 9/1056 219/130.21 |
| 7,274,000 | B2 * | 9/2007 | Dodge | B23K 9/1006 219/130.1 |
| 7,301,427 | B2 * | 11/2007 | Chang | H01F 27/38 336/170 |
| 7,351,931 | B2 * | 4/2008 | Yoshida | H01F 27/2804 219/130.21 |
| 7,468,649 | B2 * | 12/2008 | Chandrasekaran | H01F 27/38 323/358 |
| 7,515,026 | B1 * | 4/2009 | Liu | H01F 27/326 336/192 |
| 7,573,000 | B2 * | 8/2009 | Blankenship | H05H 1/36 219/121.48 |
| 7,800,901 | B2 * | 9/2010 | Borowy | B23K 9/10 165/104.33 |
| 8,022,803 | B2 * | 9/2011 | Park | H01F 27/325 336/136 |
| 8,058,962 | B2 * | 11/2011 | Zeng | H01F 27/006 336/198 |
| 8,188,708 | B2 * | 5/2012 | Altekruse | H01F 27/325 320/104 |
| 8,193,891 | B2 * | 6/2012 | Gerhard | H01F 27/326 336/182 |
| 8,242,871 | B2 * | 8/2012 | Kobayashi | H01F 27/2828 29/602.1 |
| 8,278,889 | B2 * | 10/2012 | Tateishi | H02M 3/1588 323/271 |
| 8,284,006 | B2 * | 10/2012 | Bacarisse | H01F 27/025 336/90 |
| 8,284,007 | B1 * | 10/2012 | Langner | H01F 19/04 324/117 R |

(56) References Cited

U.S. PATENT DOCUMENTS

| | | | | |
|---|---|---|---|---|
| 8,456,267 B2* | 6/2013 | Schoessow | ............ | H01F 19/08 333/24 R |
| 8,502,520 B2* | 8/2013 | Chandrasekaran | ..... | H01F 27/38 323/250 |
| 8,680,431 B2* | 3/2014 | Stava | ................ | B23K 9/1006 219/130.21 |
| 8,928,441 B2* | 1/2015 | Prabhakaran | ........... | H01F 27/10 219/632 |
| 9,153,371 B2* | 10/2015 | Iwakura | ............... | H01F 27/006 |
| 9,289,844 B2* | 3/2016 | Sigl | ........................ | B23K 9/32 |
| 2002/0006027 A1* | 1/2002 | Rodriguez | ........ | H05K 7/20909 361/688 |
| 2002/0056708 A1* | 5/2002 | Moriguchi | ........... | B23K 9/1056 219/130.21 |
| 2002/0057159 A1* | 5/2002 | Mercado | ............. | H01F 27/2847 336/83 |
| 2002/0063116 A1* | 5/2002 | Ikeda | ................... | B23K 9/1056 219/130.21 |
| 2002/0070835 A1* | 6/2002 | Dadafshar | ............. | H01F 27/027 336/200 |
| 2002/0175780 A1 | 11/2002 | Setty et al. | | |
| 2003/0020582 A1* | 1/2003 | Naito | ....................... | H01F 38/42 336/198 |
| 2004/0207503 A1* | 10/2004 | Flanders | .................... | H01F 3/14 336/223 |
| 2004/0239465 A1* | 12/2004 | Chen | ....................... | H01F 17/00 336/173 |
| 2005/0212637 A1* | 9/2005 | Hsueh | .................... | H01F 27/306 336/182 |
| 2006/0027545 A1* | 2/2006 | Stava | .................... | B23K 9/0956 219/130.21 |
| 2006/0124620 A1* | 6/2006 | Diekmann | ........... | B23K 9/1006 219/130.1 |
| 2006/0213890 A1* | 9/2006 | Kooken | ................ | B23K 9/095 219/130.21 |
| 2008/0087653 A1* | 4/2008 | Furman | .................... | B23K 9/10 219/130.21 |
| 2008/0179445 A1 | 7/2008 | Shoji et al. | | |
| 2008/0272874 A1* | 11/2008 | Chang | ...................... | H01F 27/29 336/61 |
| 2008/0272875 A1* | 11/2008 | Huang | ................. | H01F 17/0013 336/182 |
| 2008/0297126 A1* | 12/2008 | Nagano | ................. | H01F 27/385 323/271 |
| 2009/0114624 A1* | 5/2009 | Ogoshi | .................. | B23K 37/02 219/86.25 |
| 2009/0129124 A1 | 5/2009 | Ranstad | | |
| 2009/0163817 A1* | 6/2009 | Masters | ..................... | A61B 8/12 600/466 |
| 2009/0167474 A1* | 7/2009 | Moon | ..................... | H01F 38/08 336/182 |
| 2009/0184786 A1* | 7/2009 | Lee | ..................... | H01F 27/2804 334/61 |
| 2009/0195345 A1 | 8/2009 | Sano | | |
| 2009/0309684 A1* | 12/2009 | Tsai | ..................... | H01F 27/2866 336/105 |
| 2010/0033282 A1* | 2/2010 | Hsu | ........................ | H01F 27/06 336/65 |
| 2010/0214053 A1* | 8/2010 | Chen | ..................... | H01F 27/325 336/221 |
| 2011/0049115 A1* | 3/2011 | Luo | ..................... | B23K 9/1006 219/130.21 |
| 2012/0062347 A1* | 3/2012 | Ishikawa | ............. | H01F 27/2866 336/182 |
| 2012/0063055 A1* | 3/2012 | Morong | ................. | H01F 38/32 361/268 |
| 2012/0262895 A1* | 10/2012 | Quek | ..................... | H01F 27/306 361/782 |

FOREIGN PATENT DOCUMENTS

| | | |
|---|---|---|
| GB | 2 227 126 A | 7/1990 |
| JP | H02-278705 A | 11/1990 |
| JP | H06-302437 A | 10/1994 |
| JP | H11-16751 A | 1/1999 |
| JP | 2003-178923 A | 6/2003 |
| JP | 2003-318045 A | 11/2003 |
| KR | 2009-0029971 A | 3/2009 |
| WO | 2007/041729 A1 | 4/2007 |
| WO | WO 2007086072 A2 * | 8/2007 ............. H01F 5/003 |

OTHER PUBLICATIONS

International Search Report of PCT/AT2012/000273, dated May 29, 2013.

Austrian Office Action dated Oct. 12, 2012 in Austrian Patent Application No. A 1601/2011 with English translation of relevant parts.

* cited by examiner

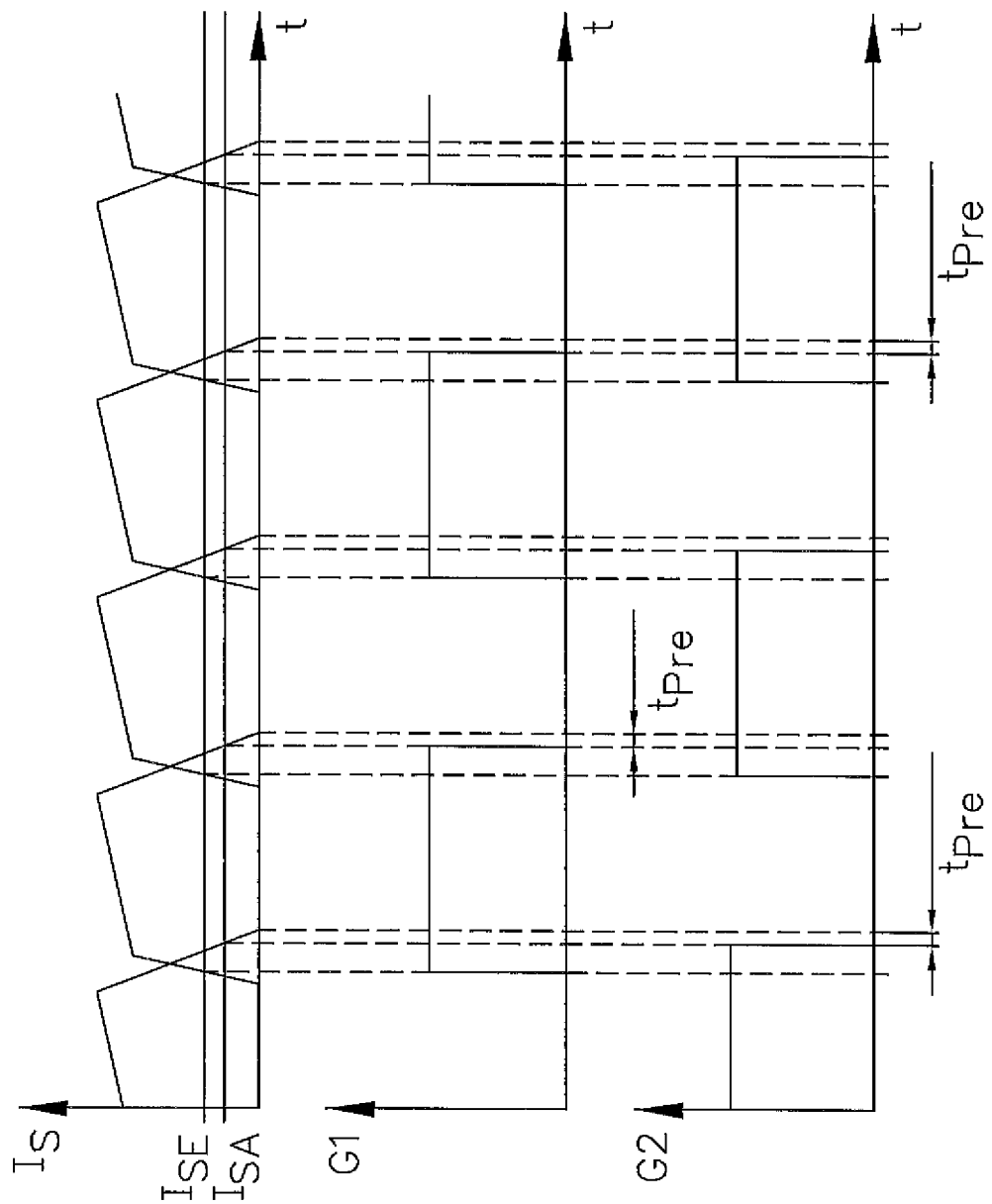

HEAVY-CURRENT TRANSFORMER HAVING A MULTI-POINT CONTACTING, TRANSFORMER ELEMENT, CONTACT PLATE AND SECONDARY WINDING, AND METHOD FOR PRODUCING SUCH A HEAVY-CURRENT TRANSFORMER

CROSS REFERENCE TO RELATED APPLICATIONS

This application is the National Stage of PCT/AT2012/000273 filed on Oct. 31, 2012, which claims priority under 35 U.S.C. § 119 of Austrian Application No. A 1601/2011 filed on Oct. 31, 2011, the disclosures of which are incorporated by reference. The international application under PCT article 21(2) was not published in English.

The invention relates to a heavy-current transformer, in particular for a power source in order to provide a welding current of a resistance welding device, comprising at least one primary winding and at least one secondary winding.

The invention relates further to a transformer element for a heavy-current transformer comprising at least one primary winding and at least one secondary winding with center tapping.

The invention also relates to a contact plate for a heavy-current transformer with at least one primary winding and at least one secondary winding with center tapping, and to a secondary winding for a heavy-current transformer, in particular for a power source in order to provide the welding current for a resistance welding device.

Finally, the invention relates to a method for manufacturing a heavy-current transformer comprising at least one primary winding and at least one secondary winding with surfaces for contacting.

The present invention relates primarily, but not exclusively, to heavy-current transformers and their components for resistance welding devices, in particular spot welding devices, in which especially heavy direct currents in the order of some kA occur. Heavy-current transformers for other devices, in which such heavy direct currents are employed, are also covered in the subject matter of the present patent application. Examples of such devices are battery chargers, particle accelerators, equipment for electroplating or the like. WO 2007/041729 A1, for example, describes a battery charger and a current transformer for producing a correspondingly heavy direct current.

In resistance welding devices the required heavy direct currents are provided using appropriate heavy-current transformers and rectifiers. Due to heavy currents occurring, diode rectifiers are of disadvantage, because of the relatively high losses, and therefore active rectifiers comprising control elements, which are formed by respective transistors, are mainly employed. However, resistance welding devices with active rectifiers, for example synchronous rectifiers, also have relatively high losses and, thus, relatively low efficiencies. Since significant line lengths and, thus, power losses incur in prior art by the usual separate design of for example heavy-current transformer and rectification, a very poor efficiency is caused due to the heavy currents.

For example, DE 10 2007 042 771 B3 describes a method for operating the power supply of a resistance welding device by using a synchronous rectifier, through which power dissipation can be reduced and efficiency can be improved.

In production lines in the automotive industry a plurality of spot welding devices (often some 100 to 1000 individual units) is used to prepare various connections on body and chassis of the vehicle to be manufactured. As the individual spot welding devices cause high losses due to the heavy-current transformers and power lines and circuit elements already, the total losses occurring in such production lines range in extremely high dimensions, for example between 1 MW and 50 MW. Since the losses are mainly reflected in the form of heat loss, again measures must be taken to dissipate the heat, deteriorating the overall energy balance even further.

Another disadvantage arises from the fact that very high connected wattages of the electric grid are required because of the high losses of such facilities, resulting in very high expenses for manufacturing, commissioning and operation of such a facility.

To produce a single spot weld with a welding current of 20 kA, a connected wattage of the electric grid of up to 150 kW is for example required according to prior art from a present point of view, wherein using said welding current losses of up to 135 kW are generated, achieving a very poor efficiency of only some 10%.

Thus, the object of the present invention is to create a heavy-current transformer, a transformer element, a contact plate, a secondary winding for such a heavy-current transformer, and a method for manufacturing such a heavy-current transformer by which the losses can be reduced and the energy balance and the efficiency can be improved. Disadvantages of known devices and methods should be reduced or avoided.

The object according to the invention is solved by an above-mentioned heavy-current transformer, in particular for a power source, for providing a welding current of a resistance welding device, wherein at least four contacts to form a multi-point contacting are provided, said contacts being formed by four contact faces within which the at least one primary winding and the at least one secondary winding are arranged in a series/parallel connection. Due to that multi-point contacting, lines which are usually required to connect the secondary side of the heavy-current transformer to the consumer load can be prevented or the length thereof can be reduced and, thus, ohmic losses as well as contact losses can considerably be reduced. Thus, preferably short lines with preferably large cross-sections can be employed. A further advantage lies in that due to such a contacting the losses, especially contact resistance losses, are reduced. Due to the at least four contacts the current to be transmitted can be halved, thereby also causing a reduction in contact losses. This also achieves that the active contact areas can be substantially increased and thus in turn the contact resistances are reduced. By means of such a heavy-current transformer according to the invention it is achieved that the connected wattage for generating a current of 20 kA, for instance, can be reduced to only 75 kW (as compared to 150 kW with comparable prior art devices), wherein losses of 60 kW occur. Hence, an efficiency that is approximately twice as high, up to about 20% and more, can be achieved as compared to prior art.

For achieving the required transmission ratio of the heavy-current transformer for generating the heavy secondary-side current, the heavy-current transformer comprises, in accordance with a further feature of the invention, a plurality of, preferably at least 10, primary windings connected in series, and a plurality of, preferably at least 10, secondary windings with center tapping connected in parallel. The primary current flows through the primary windings of the heavy-current transformer connected in series, while the relatively heavy secondary-side current is divided between the plurality of, preferably at least 10, secondary windings connected in parallel. The partial currents on the secondary side are supplied to the corresponding circuit elements of the synchronous rectifier. By using such a division a correspondingly high transmission ratio results despite low primary and secondary numbers of turns. By using said construction, on the primary side lower numbers of turns are required in contrast to traditional heavy-current transformers, whereby the length of the primary winding can be decreased and thereby ohmic losses can be reduced. Because of the reduced number of turns of the winding and, thus, the resulting reduction of the line length, the leakage inductance of the heavy-current transformer, which is typical for the system, is in turn reduced, whereby the heavy-current transformer can be operated at higher switching frequencies, for example 10 kHz. In turn, the higher switching frequencies cause a reduction of the overall size and the weight of the heavy-current transformer and, thus, advantageous installation options. So the heavy-current transformer can, for example, be positioned as close as possible to the consumer load, for instance the electrodes of a resistance welding device. Thus, even the load of a welding robot can be reduced due to the low weight of the heavy-current transformer so that a small, more inexpensive robot will suffice.

The transmission ratio of the heavy-current transformer is 10 to 1000, preferably at least 100, to ensure the generation of the heavy secondary-side current.

A particularly advantageous construction of the heavy-current transformer can be achieved in that the heavy-current transformer comprises an I-beam of electrically conductive material, in the recesses of which at least one respective ring core is arranged, wherein one respective connection of each secondary winding is directly contacted with an inner surface and the contact plate of the I-shaped, and that the outer surfaces of the I-beam form the two first contacts of the heavy-current transformer. The I-beam thus forms the basis of the heavy-current transformer around which the secondary windings are arranged such that connection lines are not required. The outer surfaces of the I-beam represent the two first contacts of the heavy-current transformer, which are connected to the respective consumer load directly, i.e. without lines. A space-saving arrangement is achieved in that the ring cores are not designed circular, but oval. Preferably, closed ring cores are employed. By using said design the series/parallel connection of the primary windings and the secondary windings can be achieved by which the required transmission ratio of the heavy-current transformer for the heavy direct current to be provided with reduced numbers of turns of the primary windings and the secondary windings is achieved. Such a design is especially useful when at least three secondary windings connected in parallel are arranged on each side of the I-beam.

Advantageously, the center tapping of the at least one secondary winding of the heavy-current transformer is connected to the I-beam without lines. Thus, corresponding lines between the individual components can be omitted. By directly connecting the secondary winding to the center of the I-beam a substantial increase of the connection surface is also achieved, and, thus, contact losses and line losses can again be reduced.

In the above-mentioned construction of the heavy-current transformer with an I-beam, the at least one primary winding of the heavy-current transformer is arranged to extend through the at least one ring core, in particular the ring cores arranged symmetrically on both sides in the recesses of the I-beam. By using such an arrangement of the primary winding an optimum magnetic coupling to the secondary windings can be achieved.

As already mentioned above, the secondary windings are connected electrically with each other via the I-beam of the heavy-current transformer. The respective other connections of each secondary winding are connected via asynchronous rectifier and an actuation circuit preferably directly with one contact plate each of electrically conductive material, said contact plates being located above the recesses of the I-beam and the secondary windings arranged therein, wherein the outer surfaces of these contact plates form the two additional contacts of the power source.

The connections of the at least one primary winding of the heavy-current transformer are, in accordance with a further feature of the invention, led through at least one opening on an outer surface of the I-beam. From there, the connections of the primary winding of the heavy-current transformer may be connected to the corresponding power source or a power unit.

An advantageous embodiment of the heavy-current transformer results also from that one secondary winding with center tapping is each formed by two metal sheets insulated from each other and being of electrically conductive material and having a substantially S-shaped mirror-inverted course around the cross-section of a ring core and through the ring core, wherein the exterior surfaces of the metal sheets form the contacts for the connection with the circuit elements of the synchronous rectifier or the I-beam and hence the electrodes of a resistance welding device. This achieves an extremely space-saving and compact construction. At the same time, very large contact faces are available for the connection of the secondary winding with the center or the central web of the I-beam and the circuit elements of the synchronous rectifier so as to ensure the heavy current flow with as little losses as possible.

The metal sheets for forming the secondary winding of the heavy-current transformer are insulated from each other by an insulating layer, for instance, a paper layer. Thus, it is possible to arrange two secondary windings on one ring core and to thus reduce the overall size, the weight and the losses considerably. By such an arrangement a center rectifier is implemented on the secondary side, wherein the I-beam is forming the center with the one connected, in particular soldered, end of the secondary windings.

The I-beam and the contact plates of the heavy-current transformer preferably form a cube or ashlar-shaped unit, wherein an electrical insulation is arranged between the I-beam and the contact plates. The two outer surfaces of the I-beam represent the two first contacts and the two outer surfaces of the contact plates represent the two additional contacts of the power source which are offset by 90° thereto. If further components of a power source for providing a direct current, such as a synchronous rectifier, an actuation circuit, supply circuits for the synchronous rectifier and the actuation circuit are integrated into this cube or ashlar-shaped unit, an autonomous unit is formed whose input side merely has to be connected with the power unit and whose output side merely has to be connected with the respective consumer load. Usual lines between the individual circuits of a power source may be omitted or at least their length may be substantially reduced.

If cover plates are arranged on the front faces of the I-beam, a sturdier unit of the heavy-current transformer in cube or ashlar-shape may be formed.

If the cover plates are also formed of an electrically conductive material and are adapted to be screwed to the contact plates, an electrical connection of the contact plates may be achieved. Thus, a separate electrical line connecting the two contact plates electrically with one another may be omitted to establish a voltage or potential equalization and to thus avoid unbalance of the two contact plates. The cover plates thus establish the electrical connection of the two contact plates of the symmetric arrangement of the heavy-current transformer or a power source for providing the direct current.

The cover plates are electrically insulated from the I-beam of the heavy-current transformer.

The I-beam and/or the contact plates and/or the cover plates and/or the metal sheets for forming the secondary winding of the heavy-current transformer are preferably formed of copper or a copper alloy, preferably with a silver coating. Copper or copper alloys have optimum electrical properties and exhibit good thermal conductivity, whereby thermal losses occurring can be discharged faster. The silver coating prevents the copper or the copper alloy from oxidizing. Instead of copper or copper alloys also aluminum or aluminum alloys come into consideration, which have a weight advantage over copper, although the resistance to corrosion is not that high. Instead of a silver coating also a coating of tin and other materials or compounds or layers thereof is possible.

On the outer surfaces of the I-beam as well as on the outer surfaces of the contact plates connection devices, preferably bore holes with a thread to receive screws, can be arranged. Via these connection devices both the mechanical and the electrical connection of the power source to the components of the consumer load, for instance the gun arms of a resistance welding device, can be established. Moreover, various other elements may be attached to the outer surfaces of the I-beam or the contact plates by such connection devices.

In accordance with a further feature of the invention, at the first secondary winding of each side of the I-beam a current transducer each is arranged for measuring the current through this secondary winding, said current transducers being connected with an actuation circuit. The current transducers measures the secondary-side current due to which the circuit elements of a synchronous rectifier are activated to minimize the conduction losses and the switching losses. In the case of a symmetrical arrangement of the heavy-current transformer or of a power source with an I-beam comprising the heavy-current transformer as a basis of the heavy-current transformer, secondary windings are arranged on both sides of the I-beam, and the current transducers are also arranged on both sides. The current transducers are each contacted directly with an actuation circuit that is arranged next to it and is connected with the respectively opposite actuation circuit via appropriate lines. It is essential that, due to the parallel connection of the secondary windings, always the same current is flowing in each winding and the current flow thus has to be tapped from one secondary winding only in order to make a conclusion with respect to the entire current flow. In a parallel connection of ten secondary windings only one tenth of the entire secondary-side current flow is therefore measured by the current transducers, which is why these can be sized substantially smaller. Thus, in turn, a reduction of the overall size of the heavy-current transformer or the power source is achieved.

In order to avoid interferences from external magnetic fields, each current transducer is shielded by a housing and preferably a shielding of a magnetically conductive material. For such shieldings ferrites are especially suited materials.

For discharging the thermal losses occurring in the power source of the resistance welding device, channels for guiding a cooling fluid are preferably arranged in the I-beam and the contact plates. As a cooling fluid, water is in particular suitable, but gaseous cooling agents may also be transported through the cooling channels and the thermal losses may be discharged therethrough.

A preferred embodiment of the cooling channels is given in that two inlets for feeding the cooling fluid and one outlet for discharging the cooling fluid are arranged at an outer surface of the I-beam, wherein the cooling channels are arranged to extend from each inlet to the contact plates and via the I-beam to the outlet. The cross-section of the outlet corresponds to the sum of the cross-sections of all the inlets. This course of the cooling channels achieves that first of all the contact plates at which the circuit boards of a synchronous rectifier and of an actuation circuit with correspondingly sensitive components are arranged, are cooled with the correspondingly cold cooling fluid. Then, the less sensitive components, in particular the I-beam being in connection with the secondary windings, are cooled.

Preferably, a synchronous rectifier with circuit elements and a circuit for actuating the circuit elements of the synchronous rectifier are connected with the at least one secondary winding of the heavy-current transformer. Due to this preferably direct connection, i.e. connection without lines, between the heavy-current transformer and a synchronous rectifier as well as the actuation circuit, ohmic losses and further losses caused by such lines can be prevented. Possible supply circuits for the synchronous rectifier and the actuation circuit are preferably also integrated into the heavy-current transformer. Preferably, the power unit in order to supply the heavy-current transformer is positioned as close thereto as possible to achieve connection lines and, thus, line losses and line inductances as short as possible.

In order to minimize the conduction losses and switching losses of the circuit elements of the synchronous rectifier, the actuation circuit is designed to activate the circuit elements of the synchronous rectifier at a preset point in time before reaching zero crossing of the current in the secondary winding. By means of this preset point in time it is possible to equalize the delay occurring from the detection of the zero crossing of the secondary-side current to the activation of the respective circuit elements. This means that the switch on and switch off times of the circuit elements of the synchronous rectifier are not determined by the zero crossing of the secondary-side current, but by the achievement of defined switch on and switch off thresholds. The switch on and switch off thresholds are defined according to the switching delays to be expected. The switch on and switch off thresholds are at best designed adjustable, in order to further reduce the losses. In a heavy-current transformer of 20 kA the switching time can for example be set 100 ns prior to zero crossing so that all components, in particular the circuit elements of the synchronous rectifier, need to be switched within this time period.

The circuit elements of the synchronous rectifier are preferably connected without lines to the at least one secondary winding of the heavy-current transformer.

The actuation circuit and the synchronous rectifier are preferably arranged on at least one circuit board which is arranged on the inner surface of at least one contact plate. This arrangement of the actuation circuit and of the synchronous rectifier on the inner surface of at least one contact plate enables a direct contacting or a contacting without lines of the connections of the secondary windings with the circuit elements of the synchronous rectifier, and also a direct contacting, i.e. a contacting without lines of the outputs of the synchronous rectifier with the contact plate. Preferably, the heavy-current transformer or a power source comprising the heavy-current transformer for providing a direct current is constructed symmetrically, wherein one circuit board each with a part of the synchronous rectifier and the actuation circuit is arranged at both sides of the symmetrically arranged secondary windings below a respective contact plate.

Each circuit board of the synchronous rectifier and of the actuation circuit comprises preferably openings above which the circuit elements are arranged, and the inner surfaces of the contact plates, in the places of the openings in the circuit board of the synchronous rectifier, comprise protrusions, in particular pinnacle-shaped protrusions, so that the circuit elements can be contacted without lines via the protrusions protruding into the openings on the circuit board on the inner surface of the contact plates. Thus, connection lines between the circuit elements of the synchronous rectifier and the contact plate can be omitted, whereby on the one hand the ohmic losses can be reduced and on the other hand the thermal transition between the circuit elements and the contact plates can be improved. Finally, the production effort is also reduced since no connection lines have to be laid and connected, but the circuit elements are connected, preferably soldered, with the protrusions directly. A simple positioning of the circuit board can also be enabled by the protrusions and thus manufacturing can be facilitated substantially.

A design in which the source connections of the circuit elements formed by field-effect transistors are, via the protrusions, in particular pinnacle-shaped protrusions, directly connected electrically and thermally with the contact plate is also of advantage since here again the corresponding lines can be avoided.

Each circuit board is preferably arranged between the I-beam and the contact plates for forming the necessary electrical insulation. Thus, it is not necessary to provide a separate electrical insulation between the I-beam and the contact plates.

The object according to the invention is also solved by a transformer element for an above-described heavy-current transformer comprising an I-shaped beam of electrically conductive material whose recesses are designed to receive at least one respective ring core with a secondary winding arranged thereon, and whose opposing inner surface(s) is/are designed to directly contact a respective connection of each secondary winding. The I-beam thus forms the basis of a heavy-current transformer around which the secondary windings are arranged such that connection lines are not required. The outer surfaces of the I-beam represent the two first contact faces which are connected to corresponding components directly, i.e. without lines. A space-saving arrangement is achieved in that the ring cores are not designed circular, but oval. Thus, positioning between the contacts of the I-beam is possible. Preferably, closed ring cores are employed. By using said design the series/parallel connection of the primary windings and the secondary windings can be implemented by which the required transmission ratio of the heavy-current transformer for the heavy direct current to be provided with reduced numbers of turns of the primary windings and the secondary windings is achieved. Such a design is especially useful when at least three secondary windings connected in parallel are arranged on each side of the I-beam.

At least one opening for guiding the connections of the at least one primary winding is provided at an outer surface of the I-beam. The connections of the primary winding of the heavy-current transformer can be led through this opening and be connected with a corresponding power source or a power unit.

The I-beam is preferably formed of copper or a copper alloy, preferably with a silver coating. Copper or copper alloys have optimum electrical properties and exhibit good thermal conductivity, whereby thermal losses occurring can be discharged faster. The silver coating prevents the copper or the copper alloy from oxidizing. Instead of copper or copper alloys also aluminum or aluminum alloys come into consideration, which have a weight advantage over copper, although the resistance to corrosion is not that high. Instead of a silver coating also a coating of tin and other materials or compounds or layers thereof is possible.

On the outer surfaces of the I-beam connection devices, preferably bore holes with a thread to receive screws, can be arranged. Via these connection devices both mechanical and electrical connections can be established. Moreover, various other elements may be attached to the outer surfaces of the I-beam by such connection devices.

For discharging the thermal losses occurring in the heavy-current transformer, channels for guiding a cooling fluid are preferably arranged in the I-beam. As a cooling fluid, in particular water, but also a gaseous cooling agent may be transported through the cooling channels and the thermal losses may be discharged therethrough.

In this respect, preferably two inlets for feeding the cooling fluid and one outlet for discharging the cooling fluid are arranged at an outer surface of the I-beam. The cross-section of the outlet corresponds to the sum of the cross-sections of all the inlets. An appropriate course of the cooling channels achieves that first of all the more sensitive places are cooled with the cold cooling fluid and then the less sensitive components are cooled.

The object according to the invention is also solved with a contact plate for an above-mentioned heavy-current transformer, wherein protrusions, in particular pinnacle-shaped protrusions, are provided on one side for receiving a circuit board and for directly contacting circuit elements. Thus, a safe connection of the circuit board with the contact face is enabled. At the same time, the design of the protrusions enables an exact positioning of the circuit board since the circuit board comprises corresponding openings. The protrusions, however, also achieve that they protrude through the openings in the circuit board and can thus be contacted, in particular soldered, with circuit elements arranged on the opposite side of the circuit board.

On the at least one circuit board preferably a synchronous rectifier and an actuation circuit and possibly a supply circuit for the autonomous operation of the heavy-current transformer are arranged. Thus, no more control lines whatsoever are required and handling is substantially facilitated.

The protrusions are preferably designed to contact the circuit elements of the synchronous rectifier without lines in that the protrusions are arranged in correspondence with openings provided on the circuit board, so that the circuit elements of the synchronous rectifier arranged above the openings can be contacted. By means of the protrusions it is possible to contact circuit elements of a synchronous rectifier without lines. Thus, connection lines between the circuit elements of the synchronous rectifier and the contact plate can be omitted, whereby on the one hand the ohmic losses can be reduced and on the other hand the thermal transition between the circuit elements and the contact plates can be improved. Finally, the production effort is also reduced since no connection lines have to be laid and connected, but the circuit elements are connected, preferably soldered, with the protrusions directly. This enables automated manufacturing.

It is of advantage if the circuit elements are soldered directly on the protrusions since this enables robot-assisted or automated equipping and soldering. Instead of the preferred direct connecting by soldering, short connection wires, so-called bonding wires, can also be provided.

The contact plate is preferably formed of copper or a copper alloy, preferably with a silver coating. Copper or copper alloys have optimum electrical properties and exhibit good thermal conductivity, whereby thermal losses occurring can be discharged faster. The silver coating prevents the copper or the copper alloy from oxidizing. Instead of copper or copper alloys also aluminum or aluminum alloys come into consideration, which have a weight advantage over copper, although the resistance to corrosion is not that high. Instead of a silver coating also a coating of tin and other materials or compounds or layers thereof is possible.

On the outer surfaces of the contact plate connection devices, preferably bore holes with a thread to receive screws, can be arranged. Via these connection devices both mechanical and electrical connections can be established. Moreover, various other elements may be attached to the outer surfaces of the contact plate by such connection devices.

If a plurality of protrusions are arranged side by side on the contact plate, a plurality of circuit elements can correspondingly be contacted in parallel. By such a parallel connection the forward resistance of the active rectifier can be reduced. Furthermore, the parallel connection of the circuit elements achieves that a higher switching current or welding current can be switched with smaller dimensioning of the circuit elements. In this respect it is essential that for a plurality of, in particular ten, circuit elements connected in parallel the line length is halved, for instance, by actuation circuits arranged laterally on both sides, and thus much faster and more balanced actuating and connecting through of the circuit elements is achieved. Thus, it is also achieved that the switching points of the individual circuit elements are almost identical. For this purpose it is, for instance, possible that a further gate actuation is arranged in the center so as to achieve even faster switching processes.

It is, however, also of advantage if a plurality of, in particular ten, protrusions are arranged in one row for corresponding circuit elements connected in parallel, and a plurality of, in particular ten, rows of protrusions are arranged one upon the other. Thus, as many circuit elements as possible may be arranged on a small area, so that a substantially heavier current can be switched or circuit elements with smaller dimensions can be employed.

The object according to the invention is also solved by a secondary winding for an above-mentioned heavy-current transformer in which a metal sheet of electrically conductive material having a substantially S-shaped course is arranged around the cross-section of a ring core and through the ring core, wherein the exterior surfaces of the metal sheets form contacts or connections. Thus, a very compact construction is achieved which is easy to integrate into a transformer element, for instance in the form of an I-beam, of a heavy-current transformer. It is additionally achieved that the contacts of the windings are designed to have a large face, so that a safe connection without lines is ensured with one or a plurality of circuit elements and the center of the I-beam. These connections are preferably performed by soldering.

It is, however, also of advantage if a further metal sheet is arranged at the ring core for forming a further secondary winding, so that two metal sheets insulated from each other and being of electrically conductive material and having a substantially S-shaped mirror-inverted course around the cross-section of the ring core are provided, wherein the exterior surfaces of the metal sheets form contacts. Thus, the number of secondary windings in a heavy-current transformer can be doubled in a simple manner. This also achieves a center circuit (rectifier), wherein the I-beam constitutes the center.

The metal sheets are preferably insulated from each other by an insulating layer, for instance, a paper insulation. Thus, it is possible to arrange two secondary windings on one ring core and to thus reduce the overall size, the weight and the losses considerably. By such an arrangement a center rectifier is implemented on the secondary side, wherein the I-beam is forming the center with the connected, in particular soldered, one end of the secondary windings.

The metal sheets are preferably formed of copper or a copper alloy, preferably with a silver coating. Copper or copper alloys have optimum electrical properties and exhibit good thermal conductivity, whereby thermal losses occurring can be discharged faster. The silver coating prevents the copper or the copper alloy from oxidizing. Instead of copper or copper alloys also aluminum or aluminum alloys come into consideration, which have a weight advantage over copper, although the resistance to corrosion is not that high. Instead of a silver coating also a coating of tin and other materials or compounds or layers thereof is possible.

Furthermore, the object according to the invention is solved by a method for manufacturing a heavy-current transformer comprising at least one primary winding and at least one secondary winding with faces for contacting, wherein at first inner surfaces of the at least one secondary winding are connected with an I-beam of electrically conductive material of the heavy-current transformer with a first soldering material at a first, higher melting temperature, and subsequently at least one contact plate of electrically conductive material is soldered with exterior surfaces of the at least one secondary winding with a second soldering material at a second melting temperature that is lower as compared to the first melting temperature. It is of advantage that manufacturing, in particular soldering, can be automated since, due to the different melting temperatures, the connections produced already in the first soldering process at a higher melting temperature cannot fuse during the second soldering process at the lower melting temperature. Thus, the manufacturing costs are reduced substantially. It is also achieved that the best possible kind of connection can be used, so that transition losses that are as small as possible occur. In one measure, in which a circuit board is connected with the at least one contact plate by means of the first solder material at the first, higher melting temperature it is achieved advantageously that the contact plate can subsequently be subject to further soldering processes at any time.

After connecting the at least one contact plate with the circuit board, circuit elements can be connected with the circuit board and/or the contact plate, in particular with protrusions on the contact plate, by using the first soldering material at the first, higher melting temperature. The positioning and the soldering of the circuit elements and of further electronic components can be performed in a fully automated manner.

In accordance with the measures in which the circuit elements, in particular the connections or the housings of the circuit elements, are connected with the faces of the at least one secondary winding with the second soldering material at the second, lower melting temperature it is achieved that the connection between the contact plate and the circuit board cannot fuse any more. Thus, it is possible to pass the entire unit, this means the contact plate, the circuit board, the circuit elements, and further components, through a solder bath for a cost-efficient and safe manufacturing of a soldering.

It is of advantage if a first soldering material at a first, higher melting temperature between 220° C. and 300° C., in particular 260° C., and a second soldering material at a second, lower melting temperature between 120° C. and 220° C., in particular 180° C., is used. This ensures that during the second soldering process at a lower melting temperature the parts fixed during the first soldering process are not loosened or the quality of the connections would be impaired.

The invention is explained in more detail with the help of the accompanying drawings.

In which:

FIG. 16 shows time courses in order to illustrate the actuation of the circuit elements of a synchronous rectifier depending on the secondary-side currents of the heavy-current transformer.

Figure 1:
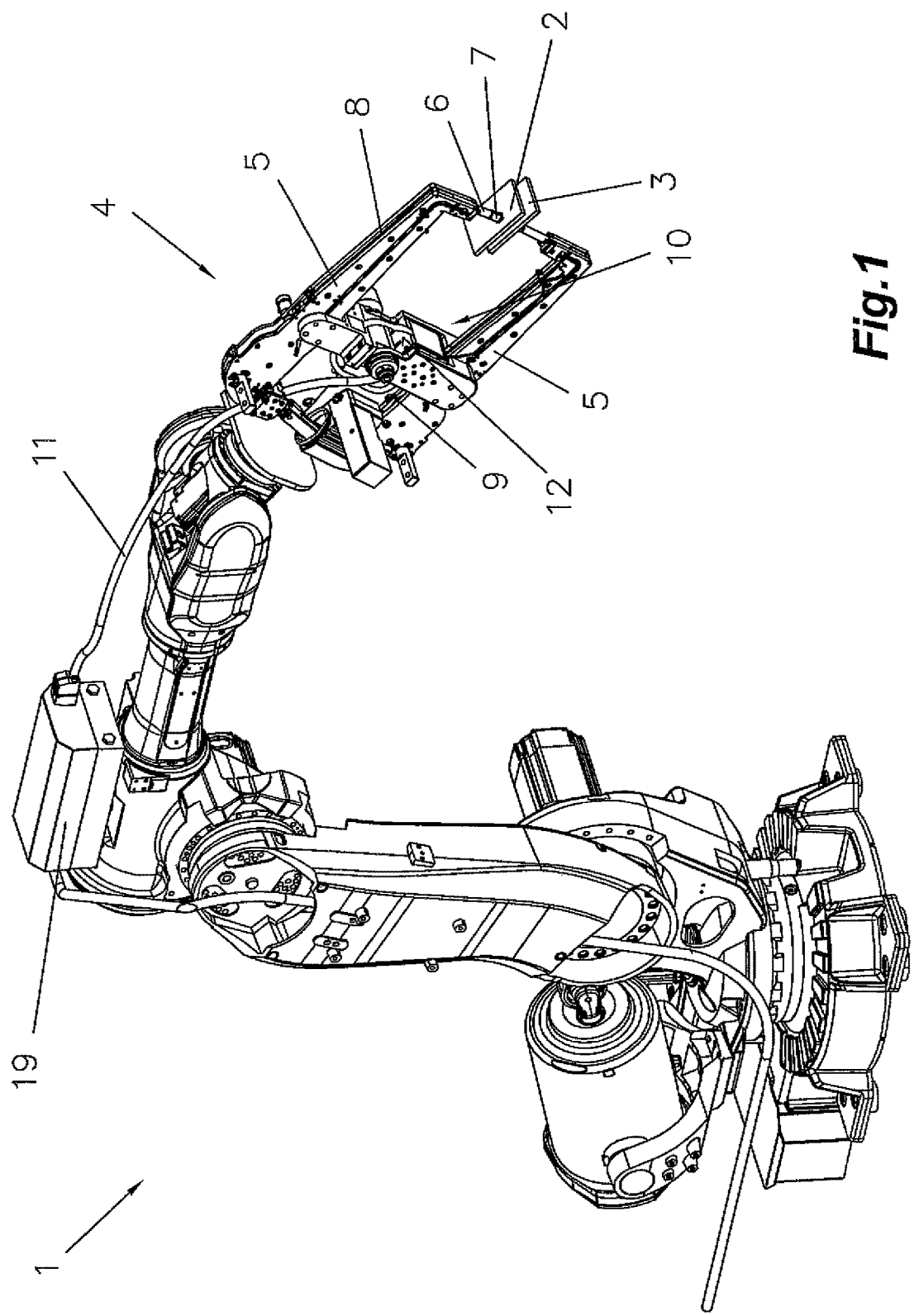
FIG. 1 is a prior art resistance welding device with a robot and a welding gun secured thereto in schematic illustration.

In the embodiment illustrated in FIGS. 1 to 16 a design of a resistance welding device 1 with essential components is described. In the figures same parts are denoted with same reference characters.

In FIG. 1 a resistance welding device 1 for resistance welding of at least two workpieces 2, 3 having a robot for manipulation is shown in perspective. The resistance welding device 1 is composed of a welding gun 4 attached to the robot and having two gun arms 5, to which holders 6 for holding an electrode 7 each are arranged. The electrodes 7 are each circulated by a band 8 which reduces the contact resistance in resistance welding and protects the electrodes 7. Moreover, the resulting image on band 8 of the spot weld produced can be analyzed and used to evaluate the weld quality. The band 8 for protection of the electrodes 7 is unwound from a winding device 9 which can be arranged on the welding gun 4 or gun arms 5, respectively, and is guided back along the gun arms 5, the electrode holders 6 and the electrodes 7 to the winding device 9, where the band 8 is re-coiled. To perform the spot welding, the welding current, which is supplied by a corresponding power unit 19, is conducted through the electrodes 7. Thereby the workpieces 2, 3 are connected together by a spot weld produced during the spot welding process. Usually, the power unit 19 in order to provide the welding current is located outside the resistance welding device 1, as schematically illustrated in FIG. 1. The welding current is supplied to the electrodes 7 or gun arms 5, which are formed electrically conductive, via appropriate lines 11. Since the amplitude of the welding current is in the range of some kA, correspondingly large cross-sections for the lines 11 are required, resulting in correspondingly high ohmic losses.

Furthermore, long primary supply lines lead to an increased inductance of the lines 11, and therefore the switching frequency at which a heavy-current transformer 12 of a power source 10 is operated is limited, resulting in very large heavy-current transformers 12. In prior art the power unit 19 is positioned in a switching cabinet next to the welding robot, so that very long supply lines, for example of up to 30 m, to the heavy-current transformer 12 are required for the welding gun 4 on the robot.

In the solution according to the invention a significant reduction in weight and size is achieved, so that a positioning of the power unit 19 directly on the robot, in particular in the section of the gun holder, is enabled. In addition, the power unit 19 is preferably designed to be water cooled.

Figure 2:
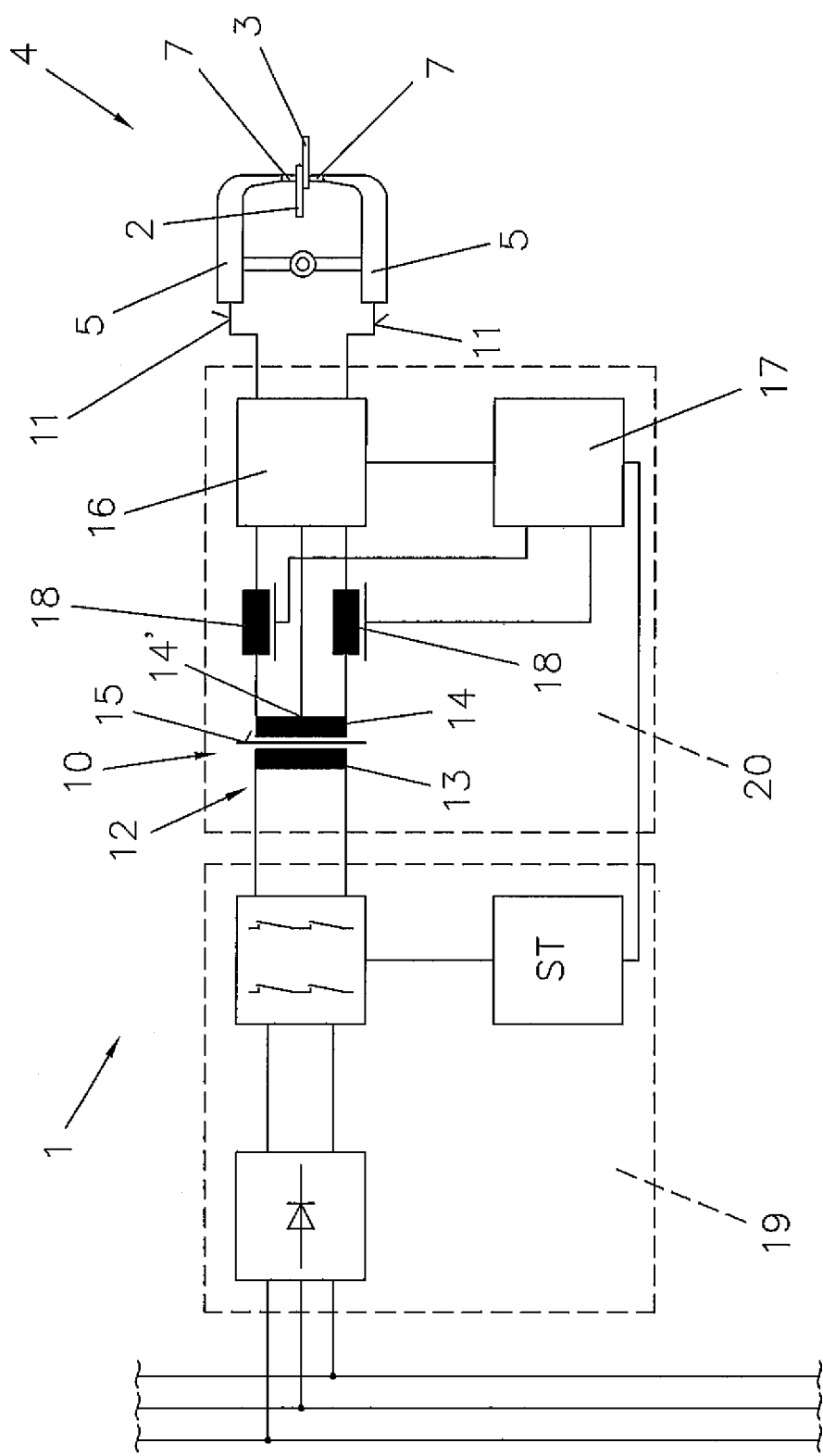
FIG. 2 is a schematic block diagram of a resistance welding device with a power source in order to provide the welding current.

FIG. 2 shows a schematic block diagram of a resistance welding device 1 with a power source 10 in order to provide the welding current. Although in the embodiment shown the power source 10 is used to provide the welding current for the resistance welding device 1, the power source 10, in particular the entire design of the power supply, can also be used to provide a direct current for other applications. The power source 10 includes a heavy-current transformer 12 having at least one primary winding 13, at least one secondary winding 14 with center tapping 14' and a ring core 15. The current transformed by means of the heavy-current transformer 12 is rectified in a synchronous rectifier 16 and supplied to the gun arms 5 or the electrodes 7 of the resistance welding device 1. To control the synchronous rectifier 16, an actuation circuit 17 is provided. The actuation circuit 17 sends corresponding trigger pulses to the circuit elements 24 of the synchronous rectifier 16 based on the secondary-side currents of the heavy-current transformer 12 measured, for example, via the current transducers 18.

As is generally known, due to the heavy welding currents as a result of the sum of the required line length, both significant ohmic and/or inductive losses as well as conduction and switching losses occur in the circuit elements 24 of the synchronous rectifier 16. Besides, also in the rectifier, in the power supply for the synchronous rectifier 16 and the actuation circuit 17 losses occur. Accordingly, the resulting efficiency of such resistance welding devices 1 is low.

To produce the primary-side current of the heavy-current transformer 12, a power unit 19 is provided, which is arranged between an electric grid and the power source 10. The power unit 19 provides the primary-side current to the heavy-current transformer 12 or the power source 10 with the desired amplitude and the desired frequency.

Figure 3:
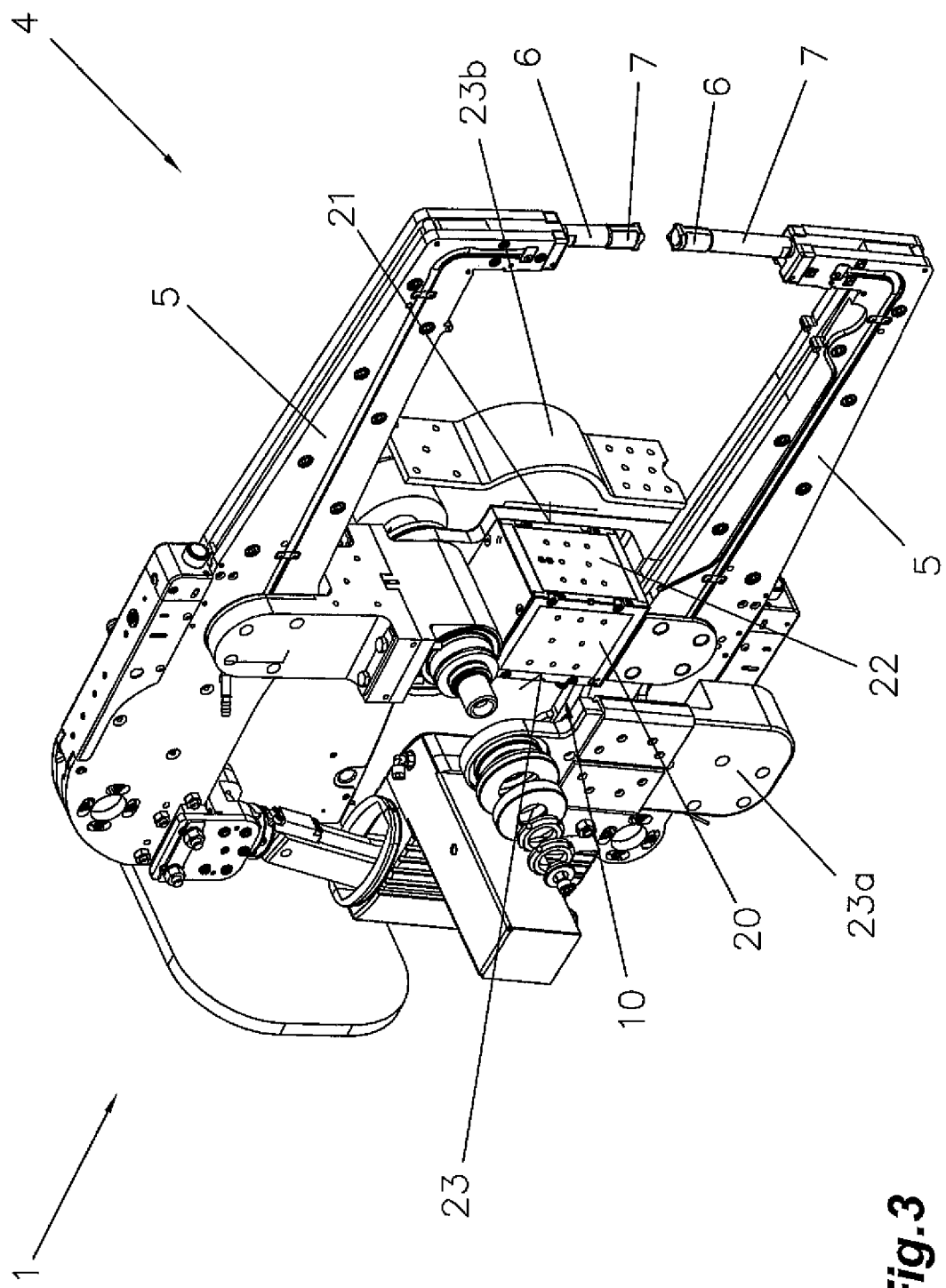
FIG. 3 is a resistance welding device, in particular a welding gun with an integrated power source in order to provide the welding current in schematic illustration.

FIG. 3 shows a resistance welding device 1 with integrated power source 10 in a schematic illustration. The power source 10 is arranged directly, in particular as a supporting member, on the welding gun 4 or the gun arms 5 of the resistance welding device 1, so that at least one part of the lines 11 in order to guide the welding current to the electrodes 7 can be omitted and, thus, the line lengths are significantly shortened, since connection with one gun arm 5 is required only. The power source 10 has at least four contacts 20, 21, 22, 23 to form a multi-point contacting, wherein two first contacts 20, 21 of one polarity are connected to the one gun arm 5 and two additional contacts 22, 23 of opposite polarity are connected to the other gun arm 5. Advantageously, the two first contacts 20, 21 of the one polarity and the other two contacts 22, 23 of the other polarity are each arranged opposite each other, wherein the two other contacts 22, 23 are substantially arranged offset to each other by 90° compared to the two first contacts 20, 21. By that multi-point contacting lines, which are usually required to connect the secondary side 14 of the heavy-current transformer 12 to the gun arms 5 or the electrodes 6 of the resistance welding device 1, can be prevented or the length thereof can be reduced and, thus, ohmic losses as well as contact losses can considerably be reduced. Thus, preferably short lines with preferably large cross-sections can be employed, while maintaining the flexibility of the welding gun 4. A further advantage lies in that due to such a contacting the losses, especially contact resistances, are reduced. Due to the at least four contacts 20, 21, 22, 23 the welding current to be transmitted can be halved, thereby also causing a reduction in contact losses, since due to the substantial increase in the active contact areas contact resistances are reduced. For example, in the dimensioning of a heavy-current transformer 12 or power source 10 in order to provide a direct current of 20 kA each of the four contacts 20, 21, 22, 23 has an area from 15 cm×15 cm to 25 cm×25 cm, preferably 20 cm×20 cm.

In the embodiment shown the power source 10 is formed substantially cube-shaped, wherein the side surface of the cube forms the contacts 20, 21, 22, 23. The two first contacts 20, 21 are connected to one electrode 7 and the two other contacts 22, 23 are connected to the other electrode 7 of the resistance welding device 1 via the gun arms 5. As can be seen in the partially exploded view, at least one gun arm 5, in particular the lower gun arm 5, is connected via a supporting member 23a of the lower gun arm 5, while the other, in particular the upper gun arm 5, is connected to the additional contacts 22, 23 via a flexible connector clamp 23b. At least one gun arm 5 is, thus, connected to the heavy-current transformer 12 directly and the other gun arm 5 is connected thereto via a very short line, for example less than 50 cm. With the lines 11 between the power source 10 and the electrodes 7 or the gun arms 5 of the resistance welding device 1 being omitted or being particularly short, ohmic and inductive losses can be considerably reduced.

Particular advantages arise when at least two contacts 20, 21 are connected directly or without lines and, thus, without contact resistances to a gun arm 5. This can be achieved in that those two contacts 20, 21 are virtually integrated in the power source 10 and are connected to corresponding parts of the resistance welding device 1, in particular the gun arms 5 directly, i.e. without laying of supply lines. Thus, by directly connecting a gun arm 5 to the contacts 20, 21 of the heavy-current transformer 12 a connection without lines is achieved, whereas the second gun arm 5 must be connected to the contacts 22, 23 by very short lines. This way a very high reduction of line losses can be achieved, because the line length is reduced to minimum. In prior art the heavy-current transformer is ideally positioned as close to the welding gun 4 as possible so that lines must then be laid from the heavy-current transformer 12 to the welding gun 4, whereas in the solution according to the invention the heavy-current transformer 12 is integrated in the welding gun 4 while one gun arm 5 is mounted on the heavy-current transformer 12 directly so that only the second gun arm 5 must be connected by one or two short lines. Of course, for example sliding contacts or other connecting elements can also be used instead of lines. Also losses within the power source 10 can be reduced significantly due to the compact design and the direct connection, i.e., connection without lines, of the components of the power source 10.

Advantageously, all components of the power source 10, including the synchronous rectifier 16, the actuation circuit 17, the current transducer 18 and all supply circuits for the synchronous rectifier 16 and the actuation circuit 17 are included in the cube or ashlar-shaped unit. That is, by the integration of the electronic components/circuits a structural unit is created in the form of a cube, where the user only needs to provide energy in the form of corresponding alternating voltage or corresponding alternating current on the primary side, in order to obtain a direct current or direct voltage on the secondary side appropriately dimensioned with high performance. The control and regulation is autonomously carried out in the cube or the power source 10. So the cube and the power source 10 are versatilely applicable for supplying components with heavy direct current. In particular, the power source 10 serves to supply a low voltage and heavy current, as usual in resistance welding processes.

When used in a resistance welding process, parts of the cube-shaped power source 10 can also be formed by components of the resistance welding device 1, for example parts of the gun arms 5 or the like, as shown. The cube or power source 10 takes on a supporting function by attaching a gun arm 5 directly to the cube. The other gun arm 5 is contacted via connection lines (not shown). By using said design, long supply lines can be prevented, so that a substantial reduction of the losses is obtained. However, to have the cube integrated into such a welding gun 4, it is required to keep the size thereof as small as possible. For example, in a dimensioning of the direct current to be provided of up to 20 kA the cube or power source 10 has a side length of between 10 cm and 20 cm, particularly 15 cm. By using said compact design of the cube-shaped power source 10, it is easily possible to integrate this, for example, in the base body of the welding gun 4.

Figure 4:
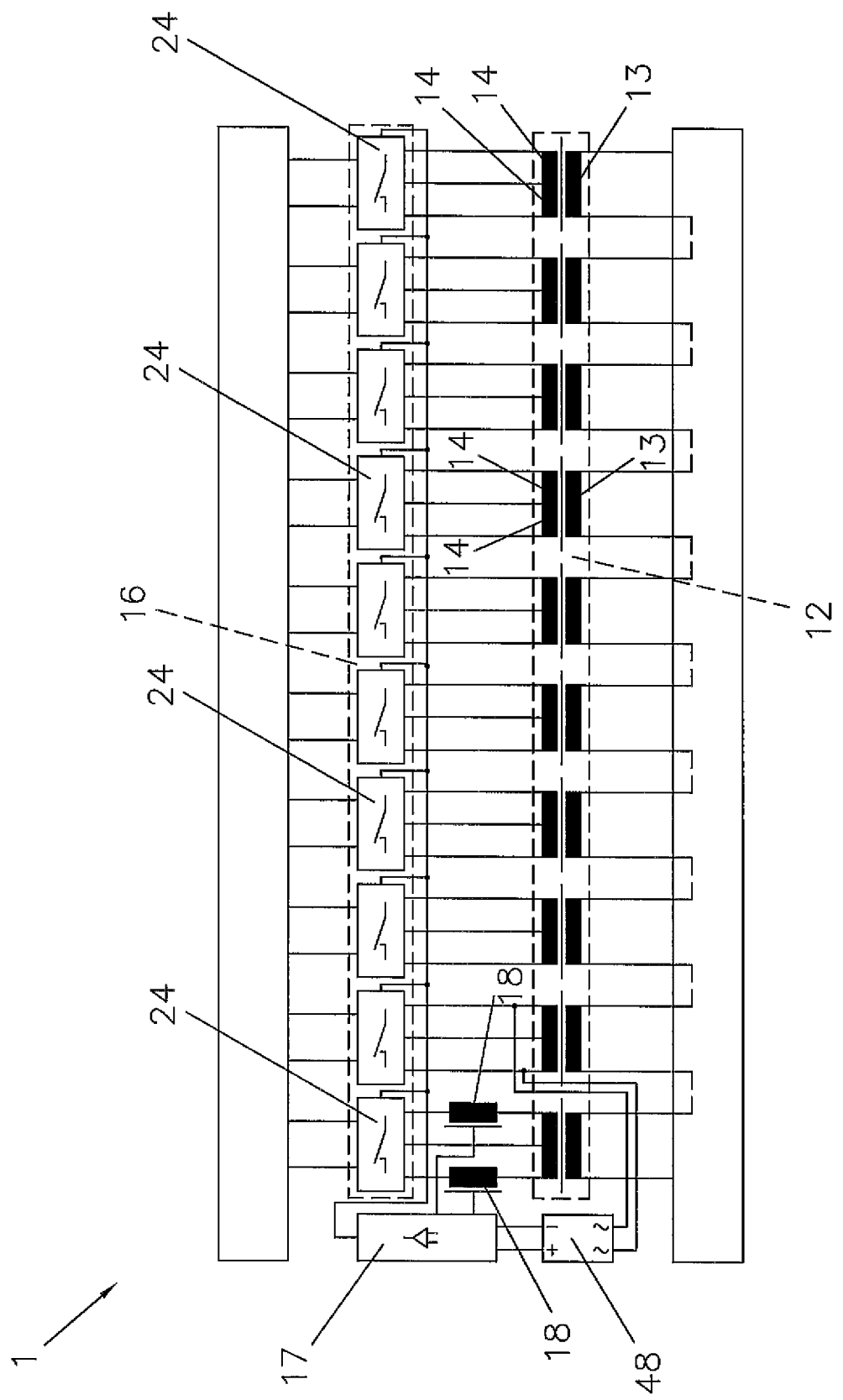
FIG. 4 is a schematic block diagram of the power source in order to provide the welding current.

FIG. 4 shows a schematic block diagram of the power source 10 in order to provide a direct current, in particular a welding current. In this preferred embodiment of the power source 10 ten primary windings 13 of the heavy-current transformer 12 are connected in series and ten secondary windings 14 of the heavy-current transformer 12 with center tapping are connected in parallel. By using such a design of the heavy-current transformer 12, the corresponding high transmission ratio in order to achieve a corresponding heavy current on the secondary side can be achieved even with low numbers of turns of the primary windings 13 and low numbers of turns of the secondary windings 14. For example, a transmission ratio of 100 can be achieved with ten primary windings 13 and also ten secondary windings 14. The primary current flows through the primary windings 13 of the heavy-current transformer 12 connected in series, while the relatively heavy secondary-side current is divided between the ten secondary windings 14 connected in parallel. The partial currents on the secondary side are supplied to corresponding circuit elements 24 of the synchronous rectifier 16. By using such a division a correspondingly high transmission ratio (here 100) results despite low primary and secondary numbers of turns. By using said construction, on the primary side lower numbers of turns are required in contrast to traditional heavy-current transformers, whereby the length of the primary winding 13 can be decreased and thereby ohmic losses can be reduced. Because of the reduced number of turns of the primary winding 13 and, thus, a resulting reduction of the line length, the leakage inductance of the heavy-current transformer 12, which is typical for the system, is in turn reduced, whereby the heavy-current transformer 12 can be operated at higher switching frequencies, for example 10 kHz. In turn, the higher switching frequencies compared to conventional heavy-current transformers cause a reduction of the overall size and the weight of the heavy-current transformer 12 and, thus, advantageous installation options. So the heavy-current transformer 12 can, for example, be positioned very close to the electrodes 7 of a resistance welding device 1. Thus, even the load of the welding robot can be reduced due to the lower weight of the heavy-current transformer 12 so that a small, more inexpensive welding robot will suffice.

Conventional transformers, in which there is no series/parallel connection of the primary and secondary windings, would require correspondingly more primary windings, which would result in substantially longer wire lengths on the primary side. Due to larger wire lengths ohmic losses increase on the one hand and a higher leakage inductance results on the other hand, which is why the frequencies, with which the prior art transformer can be operated, are limited to some kHz.

In contrast, in the construction of the heavy-current transformer 12 described herein the ohmic losses and the leakage inductance of the primary windings 13 and secondary windings 14 inherent in the system are low, which is why frequencies in the range of 10 kHz and above can be used. Thereby, a substantially smaller overall size of the heavy-current transformer 12 can in turn be achieved. The smaller overall size of the heavy-current transformer 12 or the power source 10 makes it in turn possible to arrange it more closely to the location, where the current produced is required, for example on the gun arms 5 of a resistance welding device 1.

By parallel-connecting the secondary windings 14 of the heavy-current transformer 12 the resulting heavy current on the secondary side is divided into several partial currents. These partial currents are transmitted to the circuit elements 24 of the synchronous rectifier 16, as schematically illustrated. To activate the circuit elements 24 an actuation circuit 17 is provided, drawn in in the section of the primary winding 13 and the secondary winding 14, wherein both the synchronous rectifier 16 and the actuation circuit 17 including associated sensors are arranged within the cube, that is within the heavy-current transformer 12. The synchronous rectifier 16 and the actuation circuit 17 are formed and dimensioned such that they perform regulation and control of the power source 10 autonomously, that is without external influence. Therefore, the cube has preferably no control lines for intervention from outside, but merely connections or contacts for the primary-side supply and connections or contacts for the delivery of the secondary-side electric energy generated, in particular the heavy secondary direct current.

However, it is possible that a corresponding connection of the actuation circuit 17 is led through to provide the actuation circuit 17 with given values. By making external adjustments the power source 10 can ideally be adjusted to the field of application. As known from prior art, systems for changing or transmitting data can, however, be employed which operate wirelessly, preferably inductively, magnetically or via Bluetooth, so that no control connection needs to be led through.

Control and/or regulation of the power source 10 is done via the integrated sensors. By measuring the secondary-side currents of a secondary winding 14 using corresponding current transducers 18 the actuation circuit 17 obtains the information at which points in time the circuit elements 24 of the synchronous rectifier 16 should be switched. Because the current transducers 18 only measure a fraction, here one tenth, of the secondary-side current of the heavy-current transformer 12, they can be designed smaller, again positively affecting the overall size of the power source 10.

To reduce the conduction and switching losses the circuit elements 24 of the synchronous rectifier 16 are preferably switched in zero crossing of the secondary-side currents through the secondary windings 14 of the heavy-current transformer 12. Since certain delays occur from the detection of the zero crossing of the secondary-side current by the current transducers 18 to the activation of the circuit elements 24 of the synchronous rectifier 16, according to the invention the actuation circuit 17 is formed to switch the circuit elements 24 of the synchronous rectifier 16 at a preset point in time prior to reaching zero crossing of the current in the secondary winding 14. Thus, the actuation circuit 17 causes the switching of the circuit elements 24 of the synchronous rectifier 16 at a point in time at which the currents in the secondary winding 14 of the heavy-current transformer 12 measured, by the current transducers 18 fall below or exceed certain switch-on and switch-off thresholds. By using said method it can be achieved that the circuit elements 24 of the synchronous rectifier 16 are substantially switched during zero crossing of the currents through the secondary winding 14 of the heavy-current transformer 12, whereby conduction and switching losses can be minimized (also see FIG. 16).

In FIG. 4 also the supply circuit 48 for supplying the synchronous rectifier 16 and the actuation circuit 17 with electric energy is drawn in for a primary winding 13 and a secondary winding 14. Also this supply circuit 48 is preferably integrated in the power source 10, that is in the cube. Since the supply of the synchronous rectifier 16 and the actuation circuit 17 of the power source 10 with sufficient electric energy must be ensured at the time when the delivery of the direct current, for example the welding current, is desired, a sufficiently fast activation of the supply circuit 48 is required (see FIG. 15) or it is configured such that with the activation of the power source 10 a sufficiently high supply voltage is provided as fast as possible and subsequently the required power or the required current is delivered.

Figure 5:
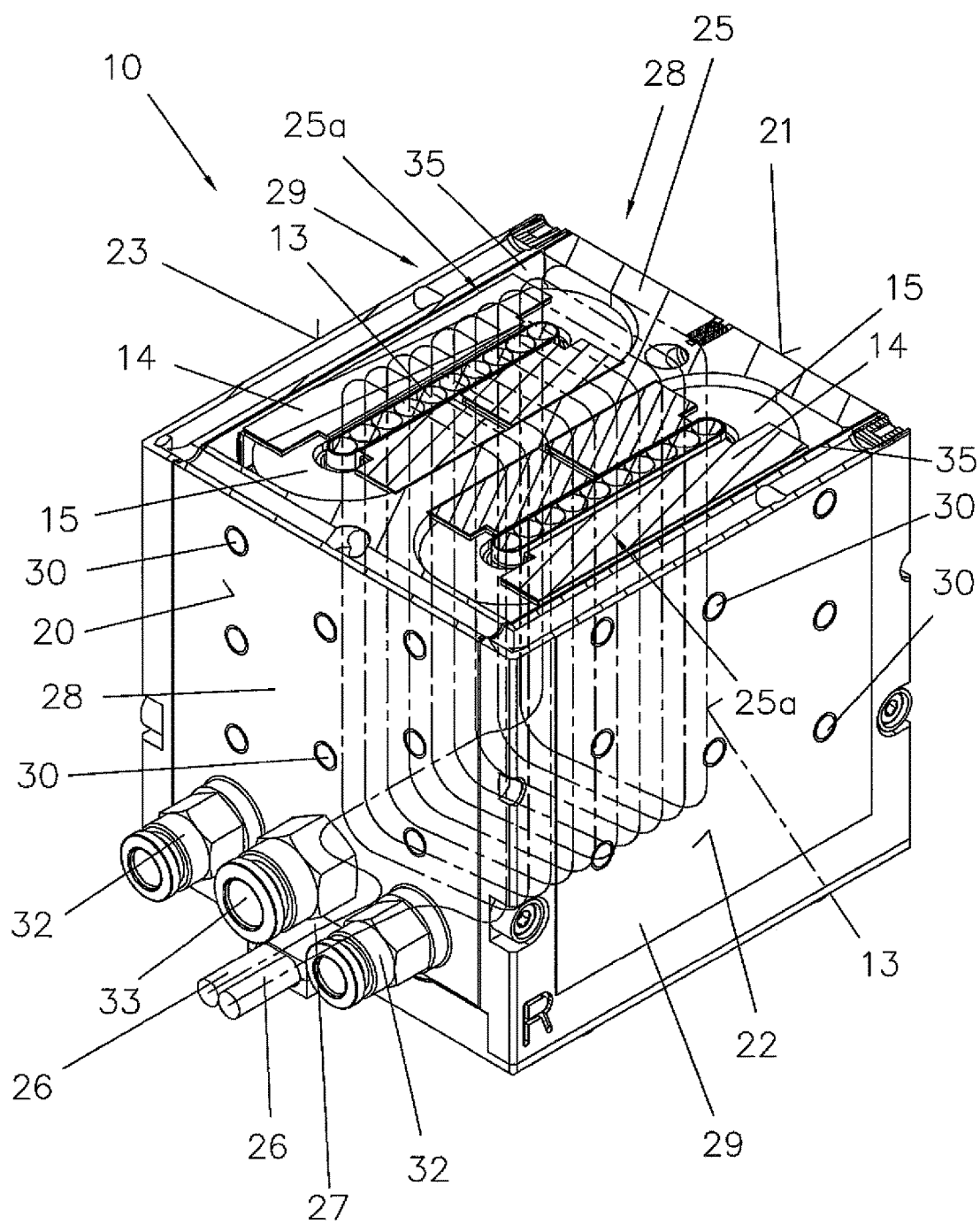
FIG. 5 shows an embodiment of the power source in order to provide a direct current.

FIG. 5 shows the embodiment of the power source 10 according to FIG. 3 in enlarged illustration. The power source 10 in order to provide a direct current, for example a welding current, has substantially the form of a cube or ashlar, wherein the lateral faces of the cube or ashlar represent the contacts 20, 21, 22, 23 via which the direct current generated can be transmitted to the relevant consumer load, such as the gun arms 5 or the electrodes 7 of a resistance welding device 1. All components of the power source 10, that is the heavy-current transformer 12, the synchronous rectifier 16, the actuation circuit 17, the current transducers 18, the supply circuit 48, etc. are included or integrated in this cube or ashlar-shaped member of the power source 10. By using said compact design the losses of the power source 10 can be kept particularly low and, thus, the efficiency thereof can substantially be increased, since an optimum shortening of lines and, thus, switching times is achieved in the cube by the integration of the electronic components, in particular of the printed circuit boards comprising the synchronous rectifier 16, the actuation circuit 17 and the supply circuit 48. By integrating the synchronous rectifier 16 and the actuation circuit 17 as well as the supply lines 48 of the power source 10 into the heavy-current transformer 12 and by parallel connecting several circuit elements 24 of the synchronous rectifier 16 and by connecting the circuit elements 24 to the secondary windings 14 of the heavy-current transformer 12 without lines, no lines are required between the synchronous rectifier 16 and the secondary side 14 of the heavy-current transformer 12, whereby possible ohmic losses and other losses occurring by using such lines are also omitted. The power unit 19 in order to supply the heavy-current transformer 12 is positioned as close thereto as possible to achieve connection lines and, thus, line losses and line inductances as short as possible. By integrating all components an autonomous unit is formed, which on the input side has to be connected to the power unit 19 and on the output side—in case of a resistance welding device 1—to the gun arms 5 or the electrodes 7 only. Common lines between the single circuits of the power source 10 are no longer needed or at least are substantially reduced in the length thereof.

The basis of the heavy-current transformer 12 of the power source 10 is a transformer element in the form of an I-beam 25 made of electrically conductive material, in particular copper or copper alloy, at best with a coating, for example of silver. In the recesses 25a of the I-beam 25 ring cores 15 comprising the secondary windings 14 of the heavy-current transformer 12 are arranged on both sides. In terms of space it is advantageous when the ring cores 15 do not have a circular, but oval or flat cross-section. In the embodiment shown, in every recess 25a of the I-beam 25 five ring cores 15 are each arranged in parallel with the respective secondary windings 14. The primary winding 13 or the primary windings 13 interconnected in series (dash-dotted line) extend through the ring cores 15 arranged in the recesses 25a of the I-beam 25 and around the web of the I-beam 25. By using that course of the primary winding 13 and by the ring cores 15 arranged particularly symmetrically in the two recesses 25a of the I-beam 25 an optimum magnetic coupling to the secondary windings 14 can be achieved. Connections 26 of the primary winding 13 are led through at least one opening 27 on an outer surface 28 of the I-beam 25. The primary winding 13 of the heavy-current transformer 12 can be connected to the corresponding power unit 19 via said connections 26. The outer surfaces 28 of the I-beam 25 form the two first contacts 20, 21 of the power source 10, which, for example, are connected to the one of the electrodes 7 of the resistance welding device 1.

Above the recesses 25a of the I-beam 25 contact plates 29 are located, the outer surfaces thereof forming the other two contacts 22, 23 of the power source 10 and being insulated against the I-beam 25. The contact plates 29 are also made of electrically conductive material, for example copper or a copper alloy, at best with a coating, for example made of silver. Copper or copper alloys have optimum electrical properties and exhibit a good thermal conductivity, whereby thermal losses occurring can be discharged faster. The silver coating prevents the copper or the copper alloy from oxidizing. Instead of copper or copper alloys also aluminum or aluminum alloys come into consideration, which have a weight advantage over copper, although the resistance to corrosion is not that high. Instead of a silver coating also a coating of tin and other materials or compounds or layers thereof is possible. Between the contact plates 29 and the corresponding connections of the secondary windings 14 of the heavy-current transformer 12 the circuit boards 35 of the synchronous rectifier 16 and the actuation circuit 17 are arranged. Said circuit boards 35 or printed circuit boards are mounted or soldered to the contact plates 29 directly and will subsequently be attached to the I-beam 25 in an insulated manner. By using said design the secondary-side connections of the heavy-current transformer 12 can be connected or contacted to the circuit elements 24 of the synchronous rectifier 16 directly without having to lay lines. The outputs of the synchronous rectifier 16 are also preferably directly connected to the contact plates 29, whereby lines are not required. The contact plates 29 are connected to the I-beam 25, preferably screwed in place (not shown). On the outer surfaces 28 of the I-beam 25 as well as on the outer surfaces of the contact plates 29 connection devices 30, such as bore holes with corresponding threads to receive screws, can be arranged. For example the lines to the gun arms 5 of a resistance welding device 1 or other devices to be supplied with the direct current can be attached via said connection devices 30, or a gun arm 5 can be attached directly to the I-beam 25 or to the contact plates 29.

Cover plates 31 can be attached to the upper side and the lower side of the cube or ashlar-shaped power source 10 and can be connected, for example screwed (see FIG. 6), to the I-beam 25 and the contact plates 29. Preferably, the cover plates 31 are also made of electrically conductive material and screwed to the contact plates 29, resulting in a sturdy unit of the heavy-current transformer 12 as well as producing an electric connection between the contact plates 29 via the cover plates 31. Thus it is achieved that a charge equalization can take place via the cover plate 31, and, thus, unbalanced loads of the heavy-current transformer 12 will not occur. Thus, a separate electric line which would connect the two contact plates 29 electrically with each other can be omitted in order to create the voltage and potential equalization and to avoid imbalances. That means that the electrical connection of both contact plates 29 of the balanced layout of the heavy-current transformer 12 or the power source 10 in order to provide the welding current is established via the cover plates 31. In this case, of course, an appropriate insulation over the I-beam 25 needs to be provided for. The contact plates 31 as well as the I-beam 25 and the contact plates 29 are preferably made of copper or a copper alloy, preferably with a silver coating.

On an outer surface 28 of the I-beam 25, in particular the first contact 20, two inlets 32 are disposed for feeding a cooling fluid and an outlet 33 for discharging the cooling fluid, in order to allow for cooling the components of power source 10. The cross-section of the outlet 33 for discharging the cooling fluid exhibits the sum of the cross-sections of all inlets 32 for feeding the cooling fluid. For an optimum course of the cooling fluid the cooling channels 39 are correspondingly arranged (see FIGS. 9 and 11). As a cooling fluid water or another liquid, but also a gaseous cooling agent, can be used.

Figure 6:
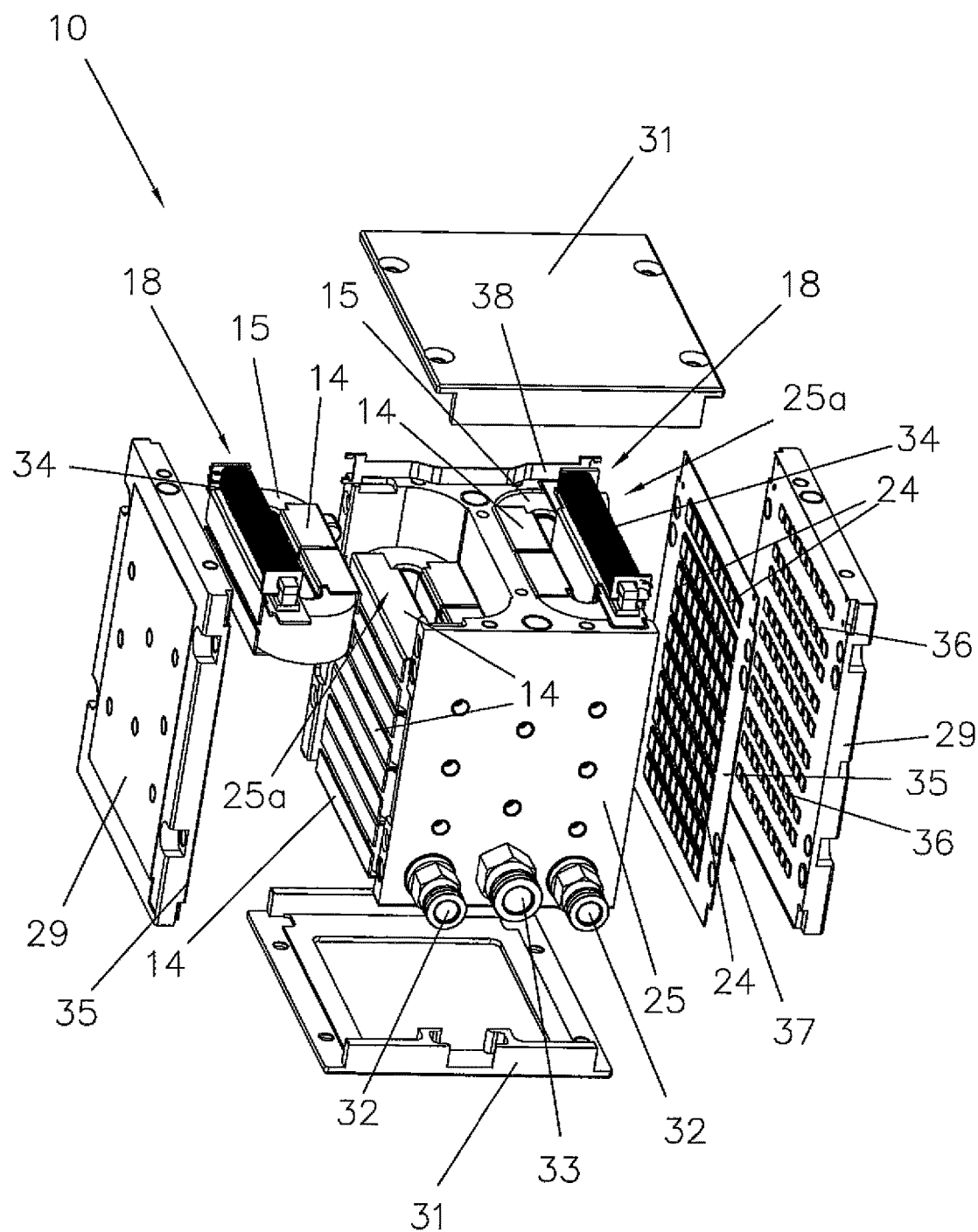
FIG. 6 shows the power source according to FIG. 5 in an exploded view.

As can be seen in the exploded view of the power source 10 according to FIG. 6, the current transducers 18 for measuring the secondary-side currents of the heavy-current transformer 12 are directly positioned on the secondary windings 14 arranged on top, which means that on each first or topmost secondary winding 14 on both sides of the I-beam 25 a current transducer 18 is arranged such that the current through this secondary winding 14 can be determined due to the current induced. To avoid manipulation of the currents measured by the current transducers 18 by external magnetic fields, preferably a housing 34 made of magnetically conductive material, for example ferrites, is arranged above the current transducers 18 for shielding.

The current transducers 18 are arranged on both sides of the I-beam 25 on each of the first and second secondary winding 14. Due to current flowing through the primary windings 13 the current discharges on one side of the I-beam 25, whereby the topmost secondary winding 14, thus, forms the first secondary winding 14, whereas on the opposite side the current is now entering into the topmost secondary winding 14 and, thus, forms the second secondary winding. By using a full bridge it is required to detect the current flow from the first and second secondary windings 14 always independently from each other, so that depending on the current the corresponding circuit elements 24 of the synchronous transformer 16 can be actuated. Thus, it is possible to actuate the circuit elements 24 of both sides of the I-beam 25 nearly synchronously by a control pulse induced by the current transducer 18.

Between the contact plates 29 and the I-beam 25 the circuit boards 35 of the synchronous rectifier 16 and the actuation circuit 17 are arranged. Simultaneously the circuit boards 35 establish the required insulation between the I-beam and the contact plates 29. The corresponding circuit elements 24 of the synchronous rectifier 16 are directly contacted with the secondary windings 14 of the heavy-current transformer 12. Via corresponding protrusions 36, in particular pinnacle-shaped protrusions, on the inner side of the contact plate 29 and corresponding openings 37 on the circuit board 35 below the circuit elements 24 a direct contacting of the circuit elements 24 with the contact plates 29 can be made. The circuit elements 24 are preferably formed of suitable field-effect transistors, the drains of which are formed by the housings thereof. The housings of the field-effect transistors are connected to at least one secondary winding 14 of the heavy-current transformer 12 directly or without lines, so that between these units no lines are required. For example, field-effect transistors made of silicon or gallium nitride are employed. The current transducers 18 are directly connected to the circuit board 35 of the synchronous rectifier 16 and the actuation circuit 17 arranged alongside and are connected to the opposite circuit board 35 of the synchronous rectifier 16 and the actuation circuit 17 via an appropriate line 38.

The assembly of the power source 10 according to FIGS. 5 and 6 is preferably performed by a soldering process using two different soldering temperatures. At first the secondary windings 14 are connected to the recesses 25a of the I-beam 25 using a soldering material, in particular a soldering tin melting at a first, higher temperature $T_{s1}$, for example 260° C. Also the contact plates 29 are contacted with the circuit boards 35 using a soldering material melting at the first, higher melting temperature $T_s1$, for example 260° C. Then in turn using a soldering material melting at the first melting temperature $T_s1$, for example 260° C., the components of the synchronous rectifier 16 and the actuation circuit 17 are mounted to the circuit board 35. Because of the capillary action of the circuit board 35 on the contact plate 29 there is no risk of loosening of the circuit board 35 from the contact plate 29. Following these steps the external contacts of the secondary windings 14 and the contacts on the circuit boards 35 are sprinkled with soldering material at a second melting temperature $T_s2$ which is lower compared to the first melting temperature $T_s1$, for example 180° C., the contact plates 29 comprising the circuit boards 35 are connected, preferably screwed, to the I-beam 25, and subsequently heated using the second melting temperature $T_s2$ of the soldering material, for example 180° C., so that the connection of the secondary windings 14 to the circuit elements 24 of the synchronous rectifier 16 is established. By using a soldering material of said second, lower melting temperature $T_s2$ it can be ensured that the soldered joints produced using the soldering material of higher melting temperature $T_s1$ are not fused or become highly resistive by crystallization processes. Finally, the primary winding 13 is threaded through the ring cores 15 and subsequently the power transformers 18 are mounted and contacted and the line 38 is laid. By attaching the cover plates 31 the power source 10 is accomplished. To reduce tensile and bending forces to the components of the power source 10, all cavities can be encapsulated prior to assembly of the cover plates 31. Via openings provided therefore (not shown) for example in the cover plates 31 an encapsulation can also be performed following the assembly of the cover plates 31.

Figure 7:
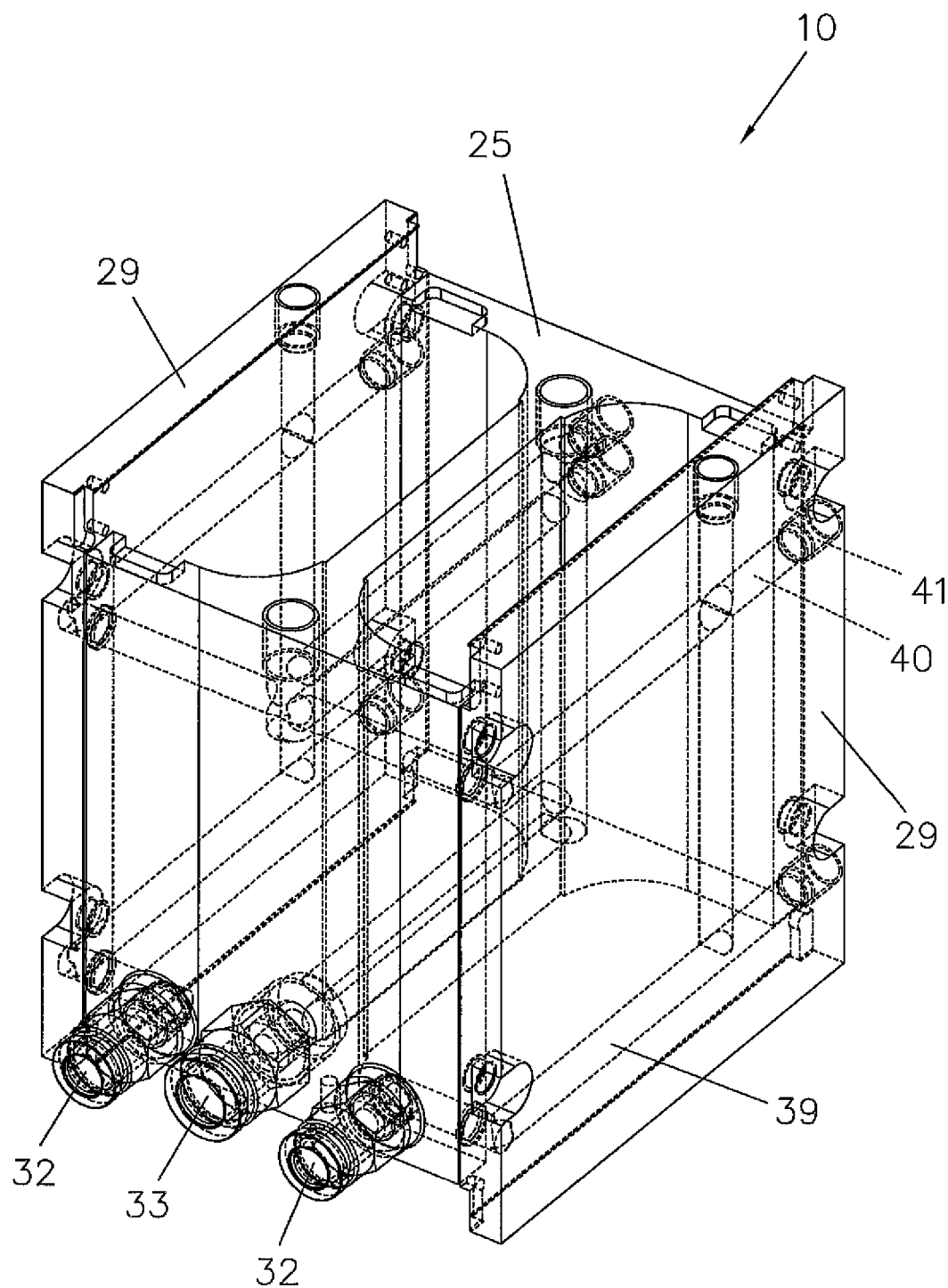
FIG. 7 shows the power source according to FIG. 5 with plotted course of the cooling channels.

FIG. 7 shows the power source 10 of FIGS. 5 and 6 illustrating the course of the cooling channels 39 (dashed line). Accordingly, the cooling channels 39 at first extend from the two inlets 32 arranged symmetrically into the contact plates 29 where the most powerful heat sources (the circuit elements 24 of the synchronous rectifier 16 and the components of the actuation circuit 17) and the most sensitive components are cooled using the cool cooling fluid. Afterwards the cooling channels 39 extend into the external elements of the I-beam 25 and into the web of the I-beam 25 where the windings of the heavy-current transformer 12 are cooled, wherein both cooling channels 39 streaming in at the side converge into one single cooling channel 39 in the web. Then the cooling channels 39 end in a common outlet 33 for the cooling fluid. The cooling channels in the contact plates 29 and in the I-beam 25 are preferably formed by corresponding bore holes 40 which, on the corresponding positions, are closed by the closure members 41. Between the I-beam 25 and the contact plates 29 corresponding sealing members 42, for example O-rings, for sealing the cooling channels 39 are arranged (see FIG. 8).

Figure 8:
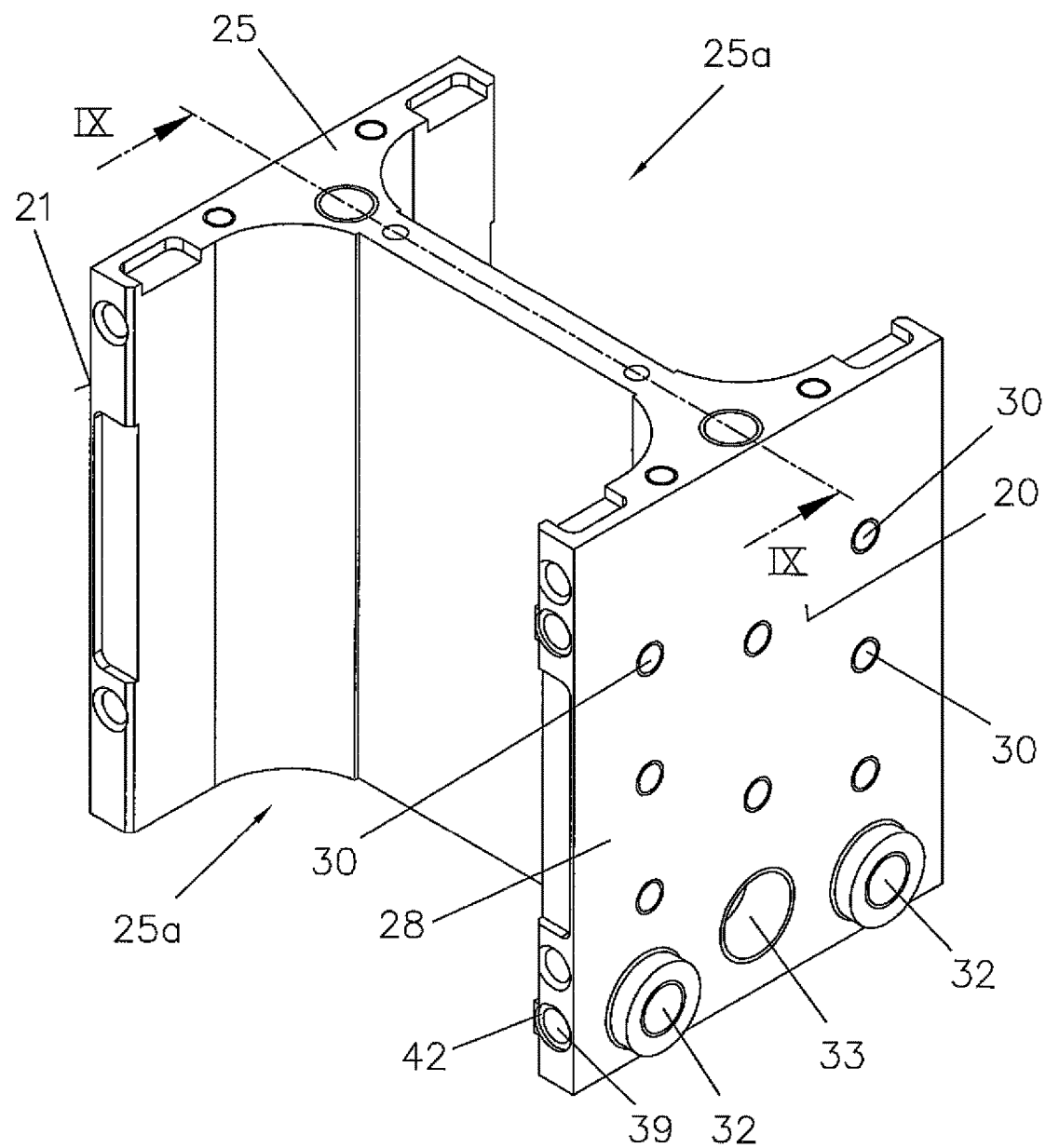
FIG. 8 is a view of the I-beam of the heavy-current transformer of the power source.

In FIG. 8 the I-beam 25 of the heavy-current transformer 12 is shown separated from the other components of the heavy-current transformer 12 or the power source 10. On the end positions of the cooling channels 39 the above-mentioned sealing members 42, for example in the form of O-rings, are arranged. The recesses 25a in the I-beam 25 are designed to precisely receive the ring core 15, whereby a very compact design is achieved. Simultaneously, the web of the I-beam 25 forms the contact surface for the center tapping of the secondary windings 14 of the heavy-current transformer 12. The center tappings of the secondary windings 14 are connected to the web of the I-beam 25 without lines, whereby in turn corresponding lines can be omitted. By directly connecting the secondary windings 14 to the I-beam 25 a substantial increase of the connection surface is also achieved, and, thus, contact losses and line losses can again be avoided.

The I-beam 25 forms the basis of the heavy-current transformer 12 around which the secondary windings 14 are arranged such that connection lines are not required. The outer surfaces of the I-beam 25 represent the two first contacts 20, 21 of the power source 10, which are connected to the gun arms 5 of the resistance welding device 1 directly, i.e. without lines. A space-saving arrangement is achieved in that the ring cores 15 are not designed circular, but oval or flat. Preferably, closed ring cores 15 are employed. By using said design the series/parallel connection of the primary windings 13 and the secondary windings 14 can be implemented by which the required transmission ratio of the heavy-current transformer 12 for the heavy direct current to be provided with reduced numbers of turns of the primary windings 13 and the secondary windings 14 is achieved. Such a design is especially useful when at least three secondary windings 14 connected in parallel are arranged on each side of the I-beam 25.

Figure 9:
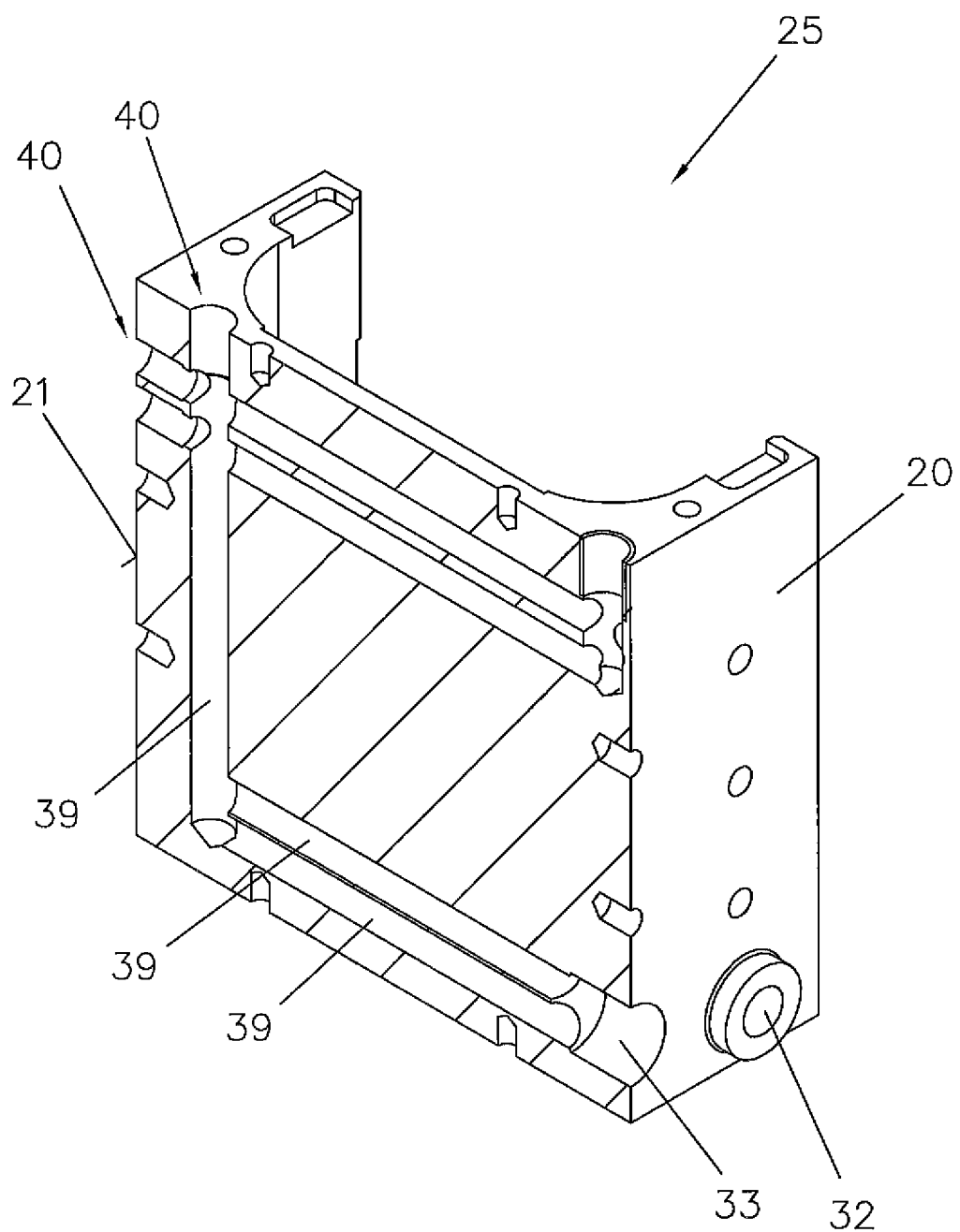
FIG. 9 shows the I-beam according to FIG. 8 in section.

FIG. 9 shows the sectional view of the I-beam 25 of FIG. 8 along intersecting line IX-IX. In this figure the course of the cooling channels 39 to the common outlet 33 for the cooling fluid can clearly be seen.

Figure 10:
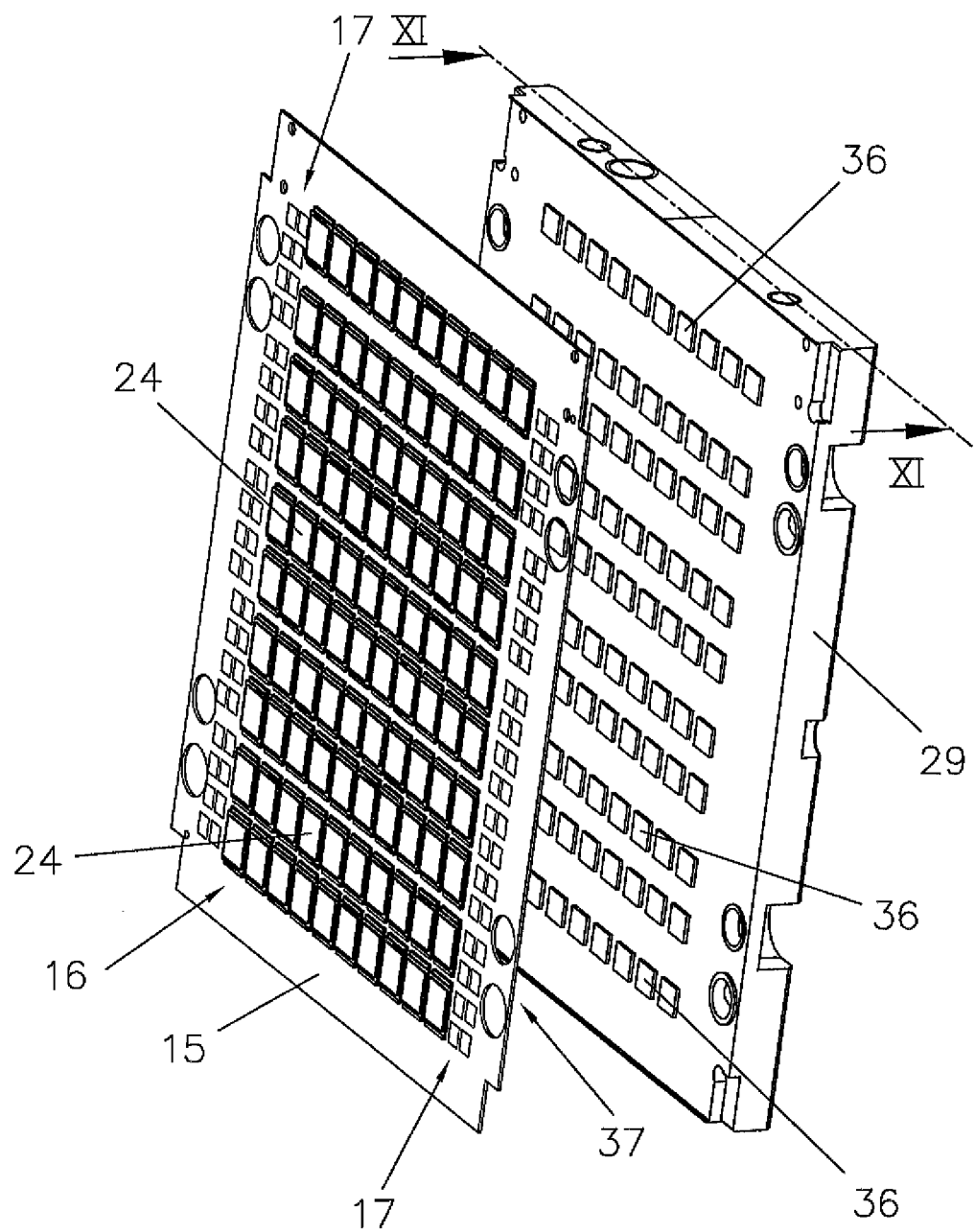
FIG. 10 is a contact plate of the heavy-current transformer of the power source including the printed circuit board of the synchronous rectifier and the actuation circuit.

FIG. 10 shows a contact plate 29 of the heavy-current transformer 12 or the power source 10 as well as the circuit board 35 for the synchronous rectifier 16 and the actuation circuit 17 arranged above it in enlarged illustration. As already mentioned above, the circuit elements 24 of the synchronous rectifier 16 are on one side directly contacted to the corresponding secondary windings 14 of the heavy-current transformer 12 and are, on the other side, directly connected to the contact plate 29. For this purpose protrusions 36, in particular pinnacle-shaped protrusions, are arranged on the inner surface of the contact plate 29, which protrude into corresponding openings 37 on the circuit board 35 and there contact the source connections of the circuit elements 24, which are arranged above the openings 37, directly or without lines. Because of the protrusions 36 connection lines between the circuit elements 24 of the synchronous rectifier 16 and the contact plates 29 can be omitted, whereby, one the one hand, ohmic losses can be reduced and, on the other hand, the thermal transfer between the circuit elements 24 and the contact plates 29 can be improved. Finally, the production effort is also reduced, since no connection lines need to be laid and connected, but the circuit elements 24 are connected, preferably soldered, directly to the protrusions 36. Also a simple positioning of the circuit board 35 is enabled and, thus, the production is substantially simplified.

By arranging the actuation circuit 17 and the synchronous rectifier 16 on the circuit board 35, which is arranged on the inner side of the contact plate 29, the direct contacting or contacting of the connections of the secondary windings 14 to circuit elements 24 of the synchronous rectifier 16 without lines is achieved as well as a direct contacting or contacting of the outputs of the synchronous rectifier 16 to the contact plate 29 without lines. Preferably, the heavy-current transformer 12 or the power source 10 in order to provide the direct current is designed symmetrically, wherein on both sides of the secondary windings 14, which are symmetrically arranged, one circuit board 35 each is arranged with a portion of the synchronous rectifier 16 and the actuation circuit 17 below one contact plate 29 each.

In the synchronous rectifier 16 according to FIG. 10 ten circuit elements 24 are each arranged in a row. To ensure that all circuit elements 24 connected in parallel are actuated substantially simultaneously and run-time losses have only little effects, a symmetrical actuation of the circuit elements 24 from both sides is performed, that means that preferably five circuit elements 24 are each actuated from the right and the left via gate drivers arranged on both sides. Also different actuation options, such as an additional gate driver extending centrally, can be arranged, whereby the line lengths and the inductances thereof are divided into three. By such a parallel actuation of the gates of the circuit elements 24 of the synchronous rectifier 16 short actuation paths and, thus, nearly synchronous switching times of the circuit elements 24 are ensured, since no or little run-time losses occur.

During mounting of the circuit board 35 onto the contact plate 29 the protrusions 36 of the contact plate 29 protrude through the openings 37 of the circuit board 35, whereby the back of the circuit board 35 can simultaneously be securely connected or soldered to the contact plate 29, and in addition circuit elements 24 arranged on the opposite side may also be connected or soldered to the contact plate 29. Thus, the usual high amount of wiring can be omitted. Also, an easy positioning of the circuit board 35 on the contact plate 29 is possible and it can no longer slip when soldering. When the synchronous rectifier 16, the actuation circuit 17 and the supply circuit 48 are arranged on the circuit board 35, an autonomous design can be achieved in the integration of the circuit board 35 in the heavy-current transformer 12. It is a further advantage to have the actuation circuit 17 arranged on both sides of the circuit elements 24 which are arranged in parallel and in series, since a shortening of the line ways to the individual circuit elements 24 is achieved. Thus, it can be ensured that within a very short period of time all of the circuit elements 24 connected in parallel are switched on. With said both-sided arrangement of the actuation circuit 17 a halving of the line length and, consequently, a reduction of line inductances and, thus, a significant shortening of the switching times is achieved. On one side of the circuit board 35 a solderable face is provided preferably over the entire face in order to be soldered to the contact plate 29, whereby a secure connection to the contact plate 29 can be achieved. Thus, the contact resistances can also be significantly reduced, because a full-faced connection of the circuit board 35 has a lower contact resistance. Instead of the preferred direct connecting by soldering, short connection wires, so-called bonding wires, can also be provided.

The supply circuit 48 is preferably designed to form correspondingly heavy switching currents, for example between 800 A and 1500 A, in particular 1000 A, and to supply the components with a corresponding supply voltage. Due to the very heavy switching current a very short switching time, especially in the ns range, can be achieved. Thereby it can be ensured that the circuit elements 24 are always switched at zero crossing or immediately just before zero-crossing at a low output current, so that no or hardly any switching losses occur. If a data communication circuit for the wireless transmission of data, preferably inductive, magnetic, or via Bluetooth, is provided, data can wirelessly be transferred from and to the circuit board 35 (not shown). Thus, an adjustment of the switching time points can be made in different areas of application of the heavy-current transformer 12. Likewise, data can be read from a storage (not shown) arranged on the circuit board 35 in order to be further processed or for control or quality control, respectively.

To provide overvoltage protection for the circuit elements 24 of the synchronous rectifier 16 it is advantageous to switch on the circuit elements 24 when they are not required. This means that in case of the application in a resistance welding device 1 the active synchronous rectifier 16 is activated in welding breaks, in order to avoid the damage of the circuit elements 24. It is monitored whether a primary current or a secondary current is flowing through the heavy-current transformer 12, and in case of no current flowing while the welding gun 4 is correspondingly positioned for a new welding spot, the actuation circuit 17 activates all circuit elements 24 by corresponding actuation of the gates. When the power source 10 is activated after positioning of the welding gun 4, meaning that a manual or automatic welding process is started, an alternating voltage is applied to the primary winding 13 of the heavy-current transformer 12, which in turn is detected by the actuation circuit 17 due to a current flowing, and, thus, the protective mode of the circuit elements 24 is deactivated. Of course, the activation and deactivation of the circuit elements 24 of the synchronous rectifier 16 can also be performed via control signals which are sent to the actuation circuit 17 via radio or inductively or magnetically. Possible overvoltages can do no harm to the circuit elements 24 switched on. Also a certain minimum protection of the circuit elements 24 by means of Zener diodes can be provided.

Figure 11:
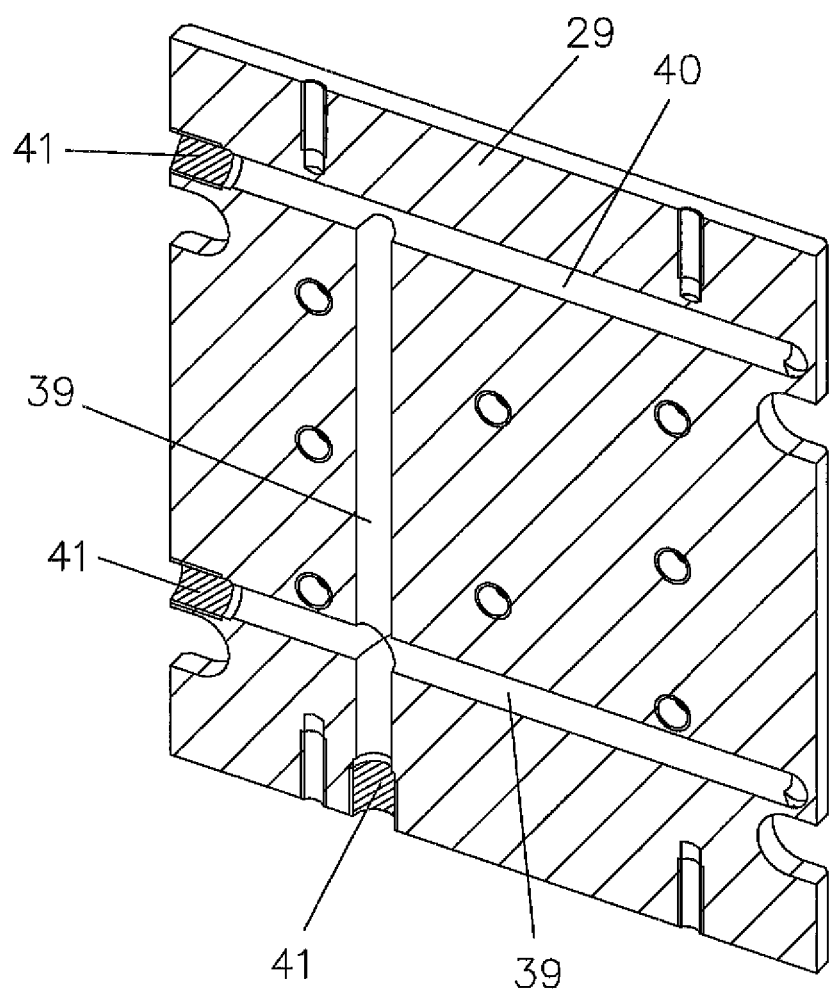
FIG. 11 shows the contact plate according to FIG. 10 in section.

FIG. 11 shows a sectional view of the contact plate 29 according to FIG. 10 along intersecting line XI-XI. In this figure the course of the cooling channels 39 can clearly be seen. The openings in the bore holes 40, resulting from the manufacturing process, in order to form the cooling channels 39 are sealed by corresponding closure members 41. The closure members 41 can be implemented by appropriate screws which are screwed into corresponding threads within the bore holes 40.

Figure 12:
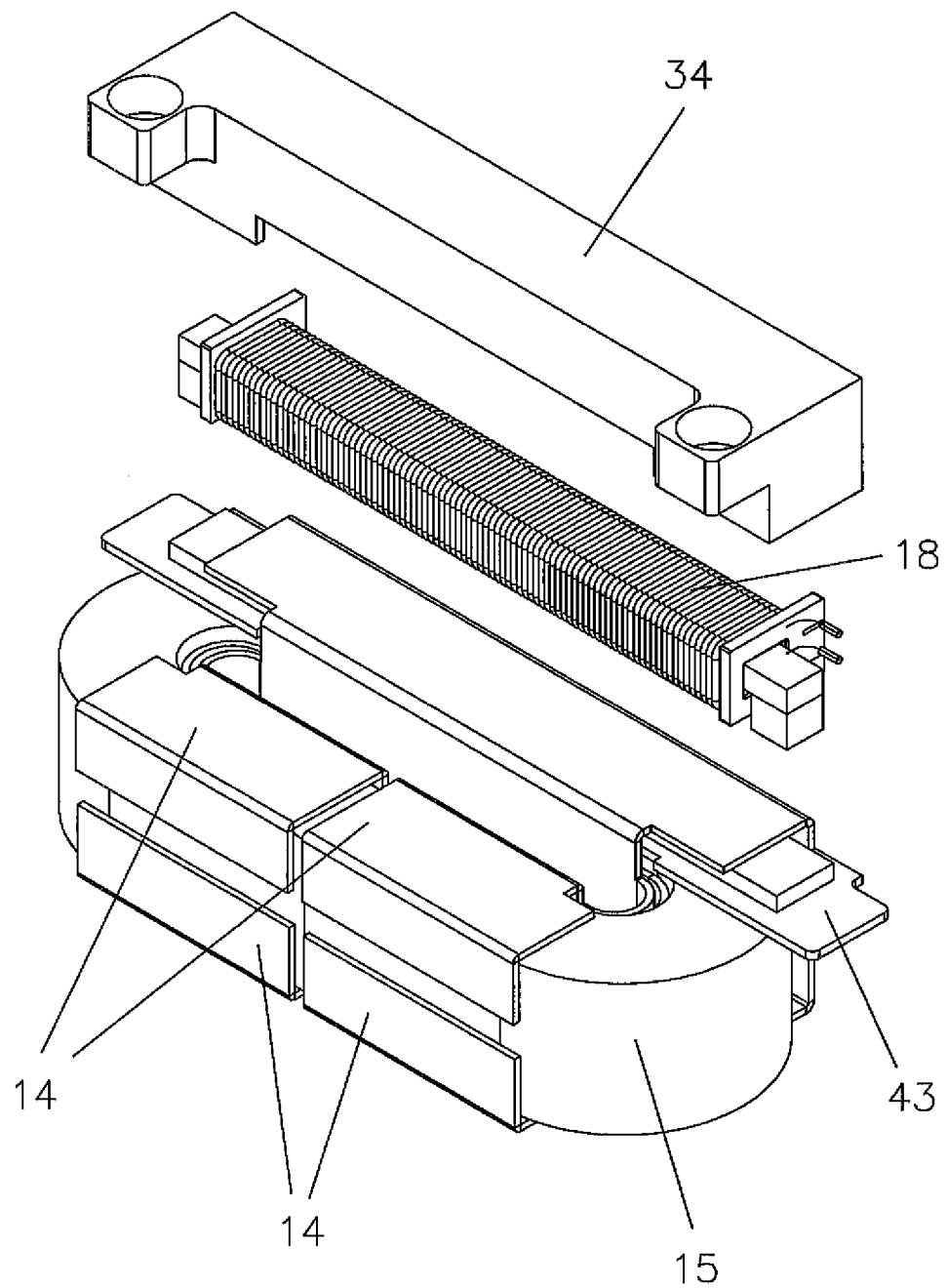
FIG. 12 shows a secondary winding of the heavy-current transformer with current transducer in exploded view.

FIG. 12 shows a ring core 15 having two secondary windings 14 of the heavy-current transformer 12 arranged thereon plus a current transformer 18 arranged above which is shown in an exploded illustration. The current transducer 18 is protected from external magnetic fields by the shielding housing 34 and a shielding 43, so that the secondary-side current through the secondary winding 14 can be measured as precisely as possible and can be supplied to the actuation circuit 17 in order to control the circuit elements 24 of the synchronous rectifier 16. For shielding from magnetic fields ferrites are especially suited materials. The current transducer 18 is positioned or secured over a portion of one of the two secondary windings 14 arranged. As known from prior art the current transducer 18 is formed of a magnetic core with a winding arranged thereon, wherein the contacts of the winding are connected to the actuation circuit 17. Further, between the ring core 15 and the secondary winding 14 the shielding 43 as well as a core plate for the current transducer 18 are arranged, wherein the core of the current transducer 18 is placed on said core plate.

In this design of the heavy-current transformer 12 two secondary windings 14 of such a design are arranged on both sides of the I-beam 25 so that the actuation circuit 17 measures the current flow through one of the secondary windings 14 connected and positioned in parallel on both sides. When the actuation circuit 17 is connected to these current transducers 18 a precise control or regulation becomes possible, since the states in the heavy-current transformer 12 can be detected via the current transducers 18.

Due to the parallel connection of the secondary windings 14 described above, in every secondary winding 14 the same current is flowing. Thus, the current only needs to be tapped from one secondary winding 14, in order to make a conclusion with respect to the entire current flow. In a parallel connection of ten secondary windings 14 only one tenth of the entire current flow is measured by the current transducers 18, which is why these can be sized substantially smaller. Thus, in turn, a reduction of the overall size of the heavy-current transformer 12 or the power source 10 is achieved. It is advantageous to have the current transducers 18 arranged substantially at an orientation of 90° to the direction of the direct current, in particular the welding current, since thereby interferences by the magnetic field induced by the direct current and, thus, measurement errors can be reduced. Thus, a very precise measurement can be performed.

Figure 13:
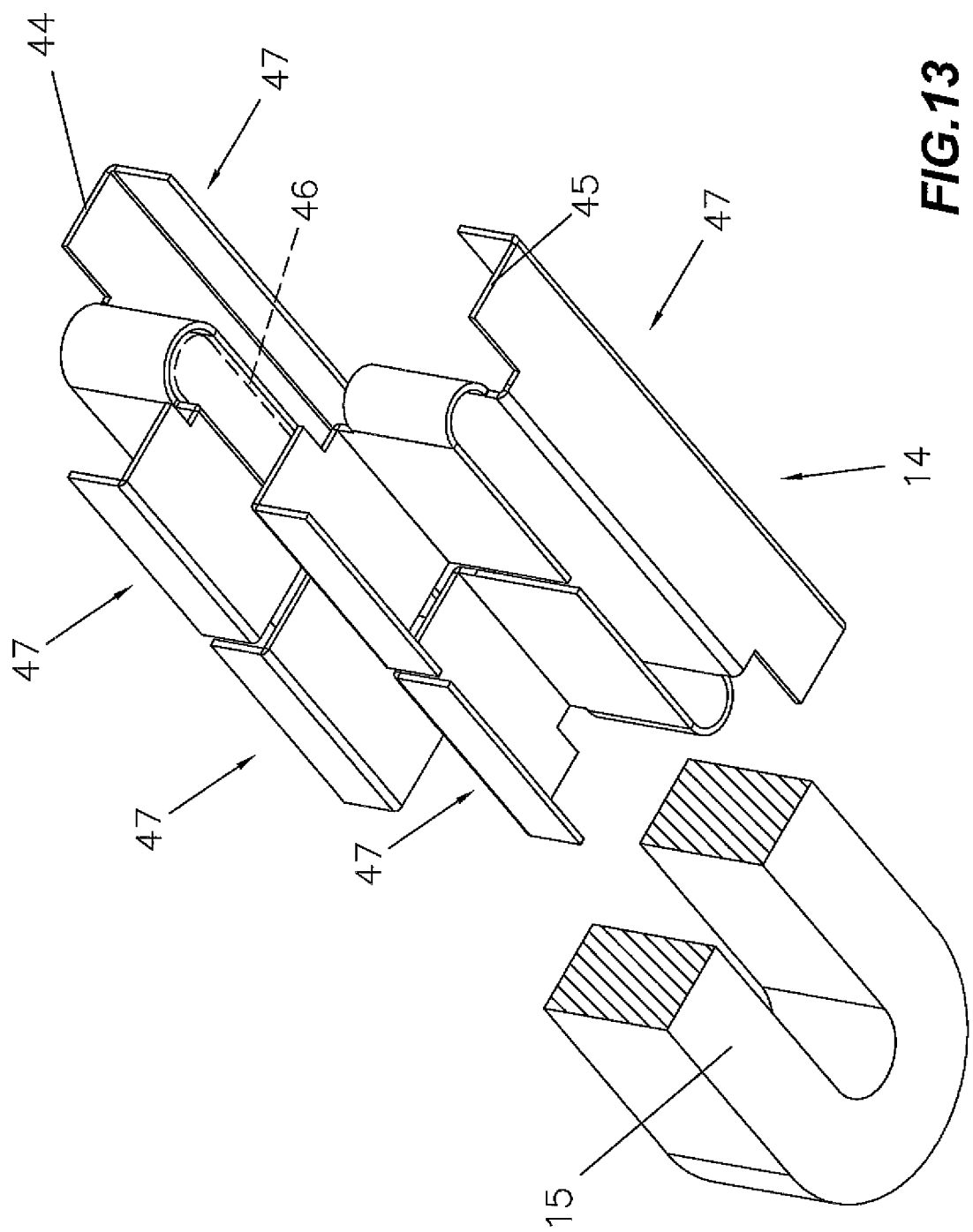
FIG. 13 shows the design of a secondary winding of the heavy-current transformer in an exploded view.

As can be seen in the exploded view according to FIG. 13, the secondary windings 14 of the heavy-current transformer 12 are preferably formed by two metal sheets 44, 45, which are insulated from each other by an insulating layer 46, for example a paper layer, having a substantially S-shaped mirror-inverted course around the cross-section of a ring core 15 and through the ring core 15, which are arranged in each other. That means that on one ring core 15 two secondary windings 14 or the parts of the secondary winding 14 with center tapping are arranged. The exterior surfaces 47 of the metal sheets 44, 45 of the secondary windings 14 simultaneously form the contact surfaces for the contacting to the circuit elements 24 of the synchronous rectifier 16 and the I-beam 25 acting as a center of the rectification. Thus, no lines are required in order to connect the secondary windings 14 of the heavy-current transformer 12 to the circuit elements 24 of the synchronous rectifier. The secondary windings 14, especially the metal sheets 44, 45 forming the secondary windings 14, are connected to the circuit elements 24 of the synchronous rectifier 16 and to the web of the I-beam 25 or the center of the rectification directly or without lines. Thus, a very space-saving and compact, lightweight design with low losses is achieved. Simultaneously relatively large surfaces 47 for connecting the secondary winding 14 to the web of the I-beam 25 and the circuit elements 24 of the synchronous rectifier 16 are provided for contacting, in order to ensure the heavy current flow with as little losses as possible. By such an arrangement a center rectifier is implemented on the secondary side, wherein the I-beam 25 is forming the center with the one connected end of the secondary windings 14.

The ring core 15 can be made of ferrites, amorphous materials or nanocrystalline raw materials. The better the materials used are with regard to the magnetic properties, the smaller the ring core 15 can be designed. However, the price of the ring core 15 is, of course, rising. In designing the metal sheets 44, 45 it is substantial that they will be folded or bent in a manner such that they are passed through the ring core 15 at least once. The two metal sheets 44, 45 or secondary windings 14 arranged on one ring core 15 are designed in a mirror-inverted way and are insulated from each other.

Figure 14:
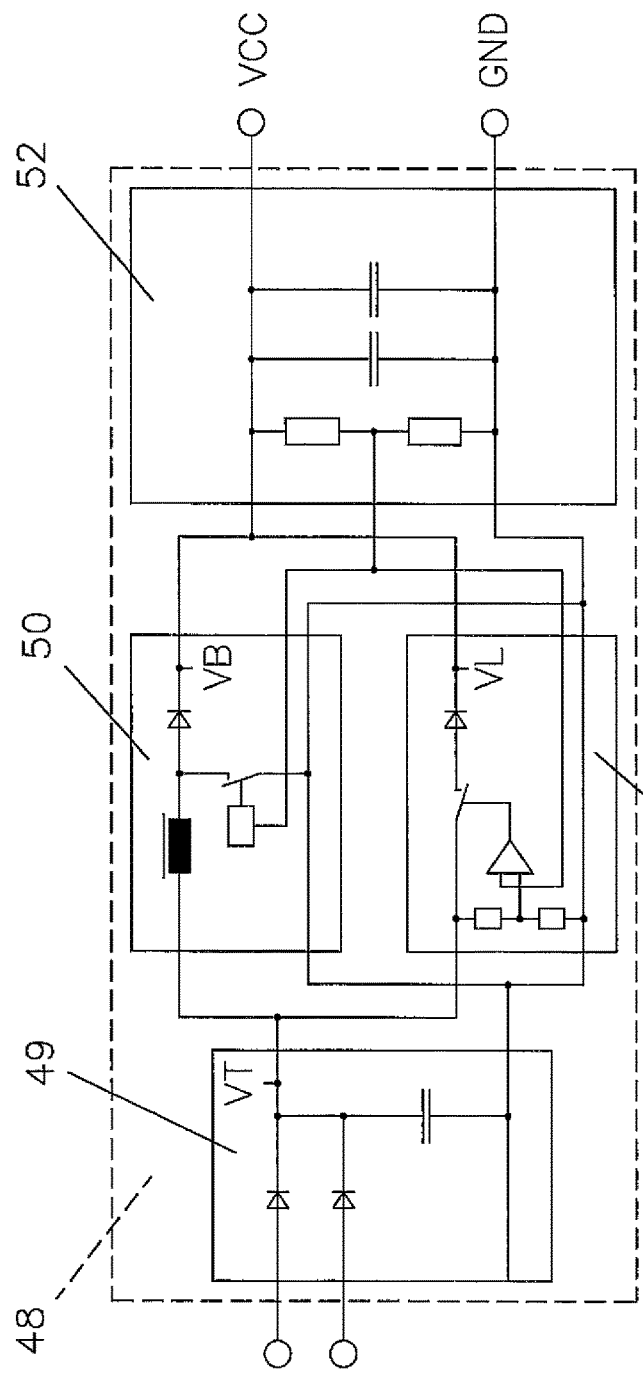
FIG. 14 is a block diagram of a circuit in order to supply the synchronous rectifier and the actuation circuit with electric energy.

FIG. 14 shows a block diagram of a supply circuit 48, especially a power supply unit, in order to supply the synchronous rectifier 16 and the actuation circuit 17 with electric energy. The supply circuit 48 is connected to the secondary side or the connections of the secondary winding 14 of the heavy-current transformer 12 and includes a peak value rectifier 49, a voltage increaser 50, a linear voltage regulator 51 and a voltage divider 52. The voltage increaser 50 or booster ensures that the supply of the components of the power source 10 is provided quickly. Simultaneously the internal supply voltage of the active synchronous rectifier 16 is generated as quickly as possible. By using the voltage increaser 50 it is ensured in the initial phase of activation that the required amplitude of the supply voltage is generated at first as early as possible, in order to ensure a secure function of the synchronous rectifier 16 integrated into the heavy-current transformer 12 at a time as early as possible.

Figure 15:
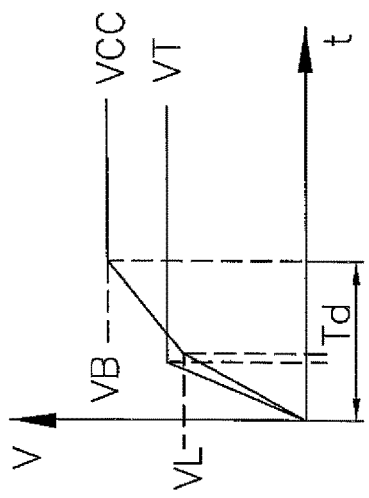
FIG. 15 shows a time course of the supply voltage of the supply circuit according to FIG. 14.

FIG. 15 shows a time course of the supply voltage V of the supply circuit 48 according to FIG. 14. The ramp of the voltage increase $\Delta V/\Delta t$ is selected sufficiently steep to ensure that the required voltage VCC is applied with a maximum delay $T_d$ at the synchronous rectifier 16 and the actuation circuit 17. For example, the delay $T_d$ should be <200 μs. By appropriate configuration of the circuits of the peak value rectifier 49 and the voltage increaser 50 and appropriately low capacities a sufficient slew rate of the voltage can be achieved. Thus, it can be said that at first the minimum height of the supply voltage is ensured with a steep increase and only then the proper supply is created.

FIG. 16 shows time courses of the secondary-side current $I_S$ of the heavy-current transformer 12 and of the control signals $G_1$ and $G_2$ for the circuit elements 24 of the synchronous rectifier 16 for illustration of the loss-free actuation. By measuring the secondary-side currents $I_S$ of a secondary winding 14 using corresponding current transducers 18 the actuation circuit 17 obtains information, at which points in time the circuit elements 24 of the synchronous rectifier 16 should be switched. To reduce conduction and switching losses the circuit elements 24 of the synchronous rectifier 16 are preferably switched in zero crossing of the secondary-side currents through the secondary windings 14 of the heavy-current transformer 12. Since certain delays $t_{Pre}$ occur from the detection of the zero crossing of the secondary-side current $I_S$ by the current transducers 18 to the activation of the circuit elements 24 of the synchronous rectifier 16, the actuation circuit 17 is, according to the invention, formed to actuate the circuit elements 24 of the synchronous rectifier 16 at a preset time prior to reaching zero crossing of the current in the secondary winding 14. Thus, the actuation circuit 17 causes the switching the of circuit elements 24 of the synchronous rectifier 16 at points in time at which the currents $I_S$ in the secondary winding 14 of the heavy-current transformer 12 measured by the current transducers 18 fall below or exceed a certain switch on threshold $I_{SE}$ and switch off threshold $I_{SA}$. By using this method it can be achieved that the circuit elements 24 of the synchronous rectifier 16 are switched substantially during zero crossing of the currents $I_S$ through the secondary windings 14 of the heavy-current transformer 12, whereby the conduction losses and switching losses of the circuit elements 24 of the synchronous rectifier 16 can be minimized. The switch on and switch off times of the circuit elements 24 of the synchronous rectifier 16 are, thus, not determined by the zero crossing of the secondary-side current, but by the achievement of the defined switch on threshold $I_{SE}$ and switch off threshold $I_{SA}$. The switch on threshold $I_{SE}$ and the switch off threshold $I_{SA}$ are defined according to the switching delays to be expected. The switch on threshold $I_{SE}$ and the switch off threshold $I_{SA}$ are at best designed adjustable, in order to further reduce the losses. In a heavy-current transformer 12 of 20 kA the switching time can for example be set 100 ns prior to zero crossing so that the circuit elements 24 of the synchronous rectifier 16 need to be switched within this time period.

A common prior art heavy-current transformer for a resistance welding device in order to provide a welding current of for example 20 kA exhibits losses of approximately 40-50 kW. To provide a welding current of 20 kA according to prior art a connected wattage of up to 150 kW is required in total, wherein the total losses add up to approximately 135 kW resulting in an efficiency of some 10%. In contrast, a heavy-current transformer 12 of the present invention exhibits losses of only some 5-6 kW. Line losses can be lowered from usually 30 kW to 20 kW. Thus, in a resistance welding device 1 according to the invention the connected wattage for generating a welding current of 20 kA can be reduced to 75 kW, since total losses add up to some 60 kW only. Hence, with some 20% the resulting efficiency is approximately twice as high as in prior art.

From this comparison potential savings can be seen clearly, in particular in production lines in the automotive industry comprising a plurality of resistance welding devices.

Basically the power source 10 or the heavy-current transformer 12 described is designed in the form of a cube or ashlar, wherein two side surfaces are formed by an I-beam 25, on which side surfaces contact plates 29, which are electrically insulated for forming the third and fourth side surfaces, are arranged. At the front face a cover plate 31 is each arranged towards the four side surfaces, which is electrically insulated against the I-beam 25, in order to form the fifth and sixth side surfaces of the cube or ashlar. Within the cube, in particular within the side surfaces, the synchronous rectifier 16 and the actuation circuit 17 are arranged on at least one circuit board 35 or printed circuit board. Thus, the cube only has connections 26 for the primary windings 13 of the heavy-current transformer 12 and the side surfaces as contact surfaces for consumption of the direct current or the direct voltage. In addition, cooling connections, in particular the inlets 32 and the outlet 33 for a cooling fluid, are also provided. Control lines for the synchronous rectifier 16 and the actuation circuit 17 integrated in the cube are preferably not provided, since this system operates autonomously and, thus, connections to the power unit 19 or to a control device of the system are not necessary. In such a design preferably no control lines are required, but the power source 10 is connected to a power unit 19 on the primary side only, whereupon on the secondary side the correspondingly dimensioned direct current of for example 15 kA to 40 kA is available. Thus, the user is not required to make any adjustments, but only needs to connect the power source 10. The integration of the actually independent separate components into such a common unit causes a substantial reduction in the overall size and, thus, the weight of the power source 10. Simultaneously, the unit can also be employed as a supporting element directly in an application, in particular a welding gun 4. Also the user convenience is substantially increased.

In the present design it is further important to connect the circuit elements 24 to the corresponding components without lines, i.e., the source connections of the circuit elements 24 formed by field-effect transistors conducting the welding wire are directly connected or soldered to the protrusions 36 of the contact plate 29, wherein the gate connections of the circuit elements 24 are also arranged or soldered directly to the circuit board 35 and to the actuation circuit 17 (gate driver) built thereupon. Thus, line inductances can be reduced by fully omitting the lines so that high switching speeds and very low conduction losses can be achieved.

In the embodiment shown and described, the heavy-current transformer 12 was dimensioned for a current of 20 kA at an output voltage of between 5V and 10V. The I-beam 25 has an overall height of 15 cm so that on both sides five secondary windings 14 having ring cores 15 can each be arranged. To get a corresponding transmission ratio of 100, ten primary windings 13 are required in the embodiment shown.

When the heavy-current transformer 12 is now to be dimensioned for a more heavy current of for example 30 kA, the number of secondary windings 14 used can simply be increased. For example, in the recesses 25a on both sides of the I-beam 25 seven secondary windings 14 can each be arranged, wherein the I-beam 25 in its height is correspondingly enlarged, for example designed by only 5 cm higher or a correspondingly larger base body is employed. Thus, the I-beam 25 of the heavy-current transformer 12 is supplemented on both sides by two secondary windings 14 only, in order to be able to provide a more heavy current. By said enlargement the contact cooling surfaces are also enlarged. Further, correspondingly more circuit elements 24 will be arranged in parallel. The primary winding 13 can be reduced to a lower number of turns, for example seven turns, so that a transmission of for example 98 is achieved. Due to the possible increase of the cross-section and by reduction of the line length higher primary winding losses are compensated for by the heavier primary current.

Thus, an increase of the secondary welding current from 20 kA to 30 kA only results in an elongation of the cube or heavy-current transformer 12 by for example 5 cm.

Since the heavy-current transformer 12 preferably operates autonomously and comprises no control lines, an outgoing communication with external components, in particular a control device, for possible error messages should be enabled. For this purpose the secondary circuit consisting of the secondary windings 14 and the synchronous rectifier 16 and the actuation circuit 17 can be used. In certain states, in particular in the idle state of the heavy-current transformer 12, said heavy-current transformer 12 can be consciously short-circuited using the synchronous rectifier 16 so that an idle state current flow in the primary lines can be detected by an external monitoring unit or a control device and, thus, due to the current a communication or error message can be effected.

For example, by integrating a temperature sensor in the heavy-current transformer 12, in particular on the synchronous rectifier 16, the temperature can be detected and evaluated. If the temperature for example exceeds a defined threshold, the synchronous rectifier 16 in the idle state, that is during welding breaks, is definedly short-circuited by the actuation circuit 17. Since the external control device knows the idle state in which no welding is performed, it is detected or recognized by the increased current flow in the primary lines of the heavy-current transformer 12. Now it can be examined by the external control device whether the cooling circuit is activated or shows a defect or the cooling efficiency is increased so that a better cooling is performed.

Of course, via corresponding switching or pulse patterns, i.e. defined opening and closing of the circuit elements 24 of the synchronous rectifier 16 in the idle state, different error messages can be communicated outwardly. For example, different temperature values, secondary voltages, currents, error messages, etc. can be sent outwards.

However, it is also possible that such a communication is performed during a welding, although such a detection is clearly more difficult. For example, corresponding signals can be modulated onto the primary-side current, in particular by the primary windings 13.

The invention claimed is:

1. A heavy-current transformer for a power source in order to provide a welding current to a resistance welding device, said heavy-current transformer comprising at least one primary winding and at least one secondary winding with center tapping, wherein at least four contacts are provided to form a multi-point contacting and connected to the heavy-current transformer, said at least four contacts forming four contact faces, wherein the four contacts or the four contact faces form lateral faces of a cube or rectangular-shaped unit,
   wherein the at one primary winding and the at least one secondary winding are arranged in a series/parallel connection within the Multi-point contacting,
   wherein an I-beam of electrically conductive material is provided,
   wherein the I-beam comprises a central web, a first recess and a second recess,
   wherein a first contact plate and a second contact plate axe arranged outside of the first recess and the second recess, respectively,
   wherein the first contact plate and the second contact plate form two contacts of the at least four contacts,
   wherein at least one respective ring core is arranged in the first recess and the second recess,
   wherein one respective connection of each secondary winding is directly contacted with one inner surface and the first contact plate,
   wherein outer surfaces of the I-beam form two additional contacts of the at least four contacts, and
   wherein the center tapping of the at least one secondary winding of the heavy-current transformer is connected with the central web of the I-beam.

2. The heavy-current transformer according to claim 1, wherein the at least one primary winding comprises a plurality of primary windings connected in series, and the at least one secondary winding comprises a plurality of secondary windings with the center tapping connected in parallel.

3. The heavy-current transformer according to claim 1, wherein the at least one primary winding is arranged to run through the at least one respective ring core and around the central web of the I-beam.

4. The heavy-current transformer according to claim 1, wherein the at least one secondary winding with the center tapping is formed by two metal sheets insulated from each other and being of electrically conductive material, wherein each of the two metal sheets have a substantially S-shaped mirror-inverted course around a cross-section of a ring core and through the ring core, and wherein exterior surfaces of the two metal sheets form contacts.

5. The heavy-current transformer according to claim 1, wherein the I-beam and the first contact plate and the second contact plate form the cube or rectangular-shaped unit, wherein an electrical insulation is arranged between the I-beam and the first contact plate and the second contact plate, wherein cover plates are arranged at front faces of the I-beam, and wherein the cover plates are formed of electrically conductive material and are adapted to be screwed to the first contact plate and the second contact plate, so that the first contact plate and the second contact plate are connected electrically.

6. The heavy-current transformer according to claim 1, wherein the I-beam and/or the first contact plate and the second contact plate and/or cover plates and/or metal sheets for forming the at least one secondary winding are formed of copper or a copper alloy.

7. The heavy-current transformer according to claim 1, wherein at a first secondary winding of each side of the I-beam a respective current transducer is arranged for measuring the current through the first secondary winding.

8. The heavy-current transformer according to claim 1, wherein channels for feeding a cooling fluid are arranged in the I-beam and the first contact plate and the second contact plate, wherein two inlets for feeding the cooling fluid and one outlet for discharging the cooling fluid are arranged at an outer surface of the I-beam, and wherein cooling channels are arranged to extend from each inlet to the first contact plate and the second contact plate and via the I-beam to the outlet.

9. The heavy-current transformer according to claim 1, wherein the at least one secondary winding is adapted to be connected with a synchronous rectifier with circuit elements and an actuating circuit for actuating the circuit elements of the synchronous rectifier.

10. The heavy-current transformer according to claim 9, wherein the actuation circuit is designed to activate the circuit elements of the synchronous rectifier at a preset point in time prior to reaching zero crossing of the current in the at least one secondary winding.

11. The heavy-current transformer according to claim 9, wherein the circuit elements of the synchronous rectifier are integrated in the multi-point contacting and connected with the at least one secondary winding.

12. A heavy-current transformer for a power source in order to provide a welding current to a resistance welding device, said heavy-current transformer comprising at least one primary winding and at least one secondary winding with center tapping, wherein at least four contacts are provided to form a multi-point contacting and connected to the heavy-current transformer, the at least four contacts forming four contact faces, wherein the at least four contacts or the four contact faces form lateral faces of a cube or rectangular-shaped unit,
- wherein the at least one primary winding and the at least one secondary winding are arranged in a series/parallel connection within the multi-point contacting,
- wherein an I-beam of electrically conductive material is provided,
- wherein the I-beam comprises a central web, a first recess and a second recess,
- wherein a first contact plate and a second contact plate are, respectively, located above the first recess and the second of the I-beam and the at least one secondary winding arranged therein,
- wherein said first contact plate and said second contact plate form two contacts of the at least four contacts,
- wherein said first contact plate and said second contact plate are of electrically conductive material and are adapted to be connected with a synchronous rectifier and an actuation circuit,
- wherein the synchronous rectifier and the actuation circuit are connected with said at least one secondary winding, and
- wherein outer surfaces of the I-beam form two additional contacts of the at least four contacts of the power source.

13. A heavy-current transformer for a power source in order to provide a welding current to a resistance welding device, said heavy-current transformer comprising at least one primary winding and at least one secondary winding with center tapping, wherein at least four contacts are provided to form a multi-point contacting and connected to the heavy-current transformer, said at least four contacts forming four contact faces, wherein the at least four contacts or the four contact faces form lateral faces of a cube or rectangular-shaped unit,
- wherein the at least one primary winding and the at least one secondary winding are arranged in a series/parallel connection within the multi-point contacting,
- wherein the at least one secondary winding is adapted to be connected with a synchronous rectifier with circuit elements and an actuating circuit for actuating the circuit elements of the synchronous rectifier,
- wherein the actuation circuit is designed to activate the circuit elements of the synchronous rectifier at a preset point in time prior to reaching zero crossing of the welding current in the at least one secondary winding,
- wherein the actuation circuit and the synchronous rectifier are arranged on at least one circuit board which is arranged on an inner surface of at least one of the first contact plate and the second contact plate,
- wherein the at least one circuit board comprises openings above which the circuit elements are arranged, and
- wherein the inner surface of the first contact plate and the second contact plate, in the places of the openings in the at least one circuit board, comprises protrusions so that the circuit elements are contacted without lines via the protrusions protruding into the openings on the at least one circuit board on the inner surface of the at least one of the first contact plate and the second contact plate.

* * * * *

UNITED STATES PATENT AND TRADEMARK OFFICE
CERTIFICATE OF CORRECTION

Page 1 of 1

PATENT NO. : 10,141,106 B2
APPLICATION NO. : 14/354982
DATED : November 27, 2018
INVENTOR(S) : Artelsmair et al.

It is certified that error appears in the above-identified patent and that said Letters Patent is hereby corrected as shown below:

In the Claims

In Column 27, Line 63 (Line 12 of Claim 1) please change "Multi-point" to correctly read: --multi-point--.

In Column 29, Line 29 (Line 20 of Claim 12) after "second" please insert: --recess--.

In Column 30, Line 32 (Line 29 of Claim 13) before "places" please delete: "the".

Signed and Sealed this
Ninth Day of April, 2019

Andrei Iancu
*Director of the United States Patent and Trademark Office*